(12) United States Patent
Hirota et al.

(10) Patent No.: US 10,673,403 B2
(45) Date of Patent: Jun. 2, 2020

(54) RESONATOR AND RESONANCE DEVICE

(71) Applicant: Murata Manufacturing Co., Ltd., Nagaokakyo-shi, Kyoto-fu (JP)

(72) Inventors: Wakana Hirota, Nagaokakyo (JP); Ville Kaajakari, Altadena, CA (US)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 459 days.

(21) Appl. No.: 15/725,469

(22) Filed: Oct. 5, 2017

(65) Prior Publication Data

US 2018/0034441 A1 Feb. 1, 2018

Related U.S. Application Data

(63) Continuation of application No. PCT/JP2016/063115, filed on Apr. 26, 2016.

(Continued)

(51) Int. Cl.
*H03H 9/21* (2006.01)
*H03H 9/05* (2006.01)
(Continued)

(52) U.S. Cl.
CPC .......... *H03H 9/0595* (2013.01); *H03H 9/10* (2013.01); *H03H 9/1057* (2013.01); *H03H 9/21* (2013.01); *H03H 9/2489* (2013.01)

(58) Field of Classification Search
CPC ........ H03H 9/21; H03H 9/215; H03H 9/0595; H03H 9/10; H03H 9/2468; H03H 9/2473;
(Continued)

(56) References Cited

U.S. PATENT DOCUMENTS 5,986,381 A    11/1999   Hoen et al.
8,110,966 B2    2/2012   Iwai
(Continued)

FOREIGN PATENT DOCUMENTS

EP    2009-171118 A    7/2009
JP    S54-58395 A      5/1979
(Continued)

OTHER PUBLICATIONS

Written Opinion of the International Searching Authority issued in International Application No. PCT/JP2016/063115, dated Jul. 19, 2016.
(Continued)

*Primary Examiner* — J. San Martin
(74) *Attorney, Agent, or Firm* — Arent Fox LLP

(57) ABSTRACT

A resonator is provided that suppresses a shift in resonant frequency. The resonator includes a vibration member including vibration arms extending therefrom with two or more of the vibration arms performing out-of-plane bend with different phases. Moreover, the resonator includes a base having a front end connected to the vibration arms and a rear end opposing the front end and structured to bend in a direction of the out-of-plane bend when the vibration arms perform the out-of-plane bend. Moreover, a frame surrounds a periphery of the vibration member and one or more holding arms are positioned between the vibration member and the frame. One end of each holding arm is connected to the base and the other end of the holding arm is connected to the frame. The holding arms bend in the direction of the out-of-plane bend when the base bends.

20 Claims, 17 Drawing Sheets

Related U.S. Application Data

(60) Provisional application No. 62/153,757, filed on Apr. 28, 2015.

(51) Int. Cl.
H03H 9/24 (2006.01)
H03H 9/10 (2006.01)

(58) Field of Classification Search
CPC .. H03H 9/2484; H03H 9/2494; H03H 9/2478; H03H 9/2489
See application file for complete search history.

(56) References Cited

U.S. PATENT DOCUMENTS

| | | |
|---|---|---|
| 8,120,234 B2 | 2/2012 | Iwai |
| 8,191,216 B2 | 6/2012 | Yamazaki et al. |
| 8,227,958 B2 | 7/2012 | Inoue et al. |
| 8,347,719 B2 | 1/2013 | Ichikawa |
| 8,415,863 B2 | 4/2013 | Yamazaki et al. |
| 9,748,921 B2 | 8/2017 | Yamazaki et al. |
| 2008/0134781 A1 | 6/2008 | Noguchi et al. |
| 2008/0290490 A1 | 11/2008 | Fujii et al. |
| 2009/0174286 A1 | 7/2009 | Yoshimatsu et al. |
| 2009/0178260 A1 | 7/2009 | Yamazaki et al. |
| 2010/0079040 A1 | 4/2010 | Iwai |
| 2010/0133958 A1 | 6/2010 | Umeki et al. |
| 2010/0156246 A1 | 6/2010 | Iwai |
| 2010/0201221 A1 | 8/2010 | Inoue et al. |
| 2012/0212109 A1 | 8/2012 | Yamazaki et al. |
| 2013/0283910 A1* | 10/2013 | Nishizawa .......... H01L 41/0475 73/504.12 |
| 2013/0305824 A1* | 11/2013 | Nishizawa .......... G01C 19/5607 73/504.12 |
| 2014/0084752 A1 | 3/2014 | Miyasaka |
| 2014/0290362 A1* | 10/2014 | Nakagawa .......... G01C 19/5607 73/504.16 |
| 2016/0197597 A1 | 7/2016 | Yamada et al. |
| 2016/0290802 A1* | 10/2016 | Nakagawa .......... G01C 19/5607 |
| 2017/0179926 A1* | 6/2017 | Hirota .................. B06B 1/0603 |

FOREIGN PATENT DOCUMENTS

| | | |
|---|---|---|
| JP | S56-85921 A | 7/1981 |
| JP | S56-85922 A | 7/1981 |
| JP | S58-111515 A | 7/1983 |
| JP | 2007-123683 A | 5/2007 |
| JP | 2009-089231 A | 4/2009 |
| JP | 2010-187054 A | 8/2010 |
| JP | 2010-283804 A | 12/2010 |
| JP | 5071058 B2 | 11/2012 |
| JP | 2015-33087 A | 2/2015 |
| WO | WO 2015/041152 A1 | 3/2015 |

OTHER PUBLICATIONS

International Search Report issued in International Application No. PCT/JP2015/079755, dated Nov. 24, 2016.
International Search Report issued in International Application No. PCT/JP2016/062673, dated Jul. 12, 2016.
International Search Report issued in International Application No. PCT/JP2016/063115, dated Jul. 19, 2016.
Written Opinion of the International Searching Authority issued in International Application No. PCT/JP2015/079755, dated Nov. 24, 2016.
Written Opinion of the International Searching Authority issued in International Application No. PCT/JP2016/062873, dated Jul. 12, 2016.

* cited by examiner

RESONATOR AND RESONANCE DEVICE

CROSS REFERENCE TO RELATED APPLICATIONS

The present application is a continuation of PCT/JP2016/063115 filed Apr. 26, 2016, which claims priority to U.S. Patent Provisional Application No. 62/153,757, filed Apr. 28, 2015, the entire contents of each of which are incorporated herein by reference.

TECHNICAL FIELD

The present disclosure relates to resonators and resonance devices in which a plurality of vibration arms vibrate in an out-of-plane bending vibration mode.

BACKGROUND

Resonance devices using MEMS (Micro Electro Mechanical Systems) techniques have been used as a timing device, for example. This type of resonance device is mounted on a printed circuit board that is incorporated in an electronic apparatus such as a smart phone or the like. The resonance device is provided with a lower side substrate, an upper side substrate forming a cavity between the lower side substrate and the upper side substrate, and a resonator disposed in the cavity between the lower side substrate and the upper side substrate.

For example, Patent Document 1 (identified below) discloses a resonator provided with a plurality of vibration arms. In this resonator, fixed ends of the vibration arms are connected to a front end of a base section, and the base section is connected to a supporting unit at a rear end thereof which is on the opposite side to the front end. The supporting unit is, for example, connected to a base unit sandwiched between a lower side substrate and an upper side substrate. In an example of FIG. 1 of Patent Document 1, by electric fields applied to the vibration arms being set in reverse directions to each other, vibrations having reverse phases to each other are generated between an inner side vibration arm and two outer side vibration arms.

Patent Document 1: Japanese Patent No. 5071058.
Patent Document 2: Japanese Unexamined Patent Application Publication No. 56-085921.

As shown in FIG. 1(c) of Patent Document 1, during the vibrations with reverse phases, torsional moment is generated in each of the vibration arms around a center axis extending in a direction parallel to a Y axis. Due to this torsional moment, in the base section of the resonator, between the center axes of the adjacent vibration arms vibrating with reverse phases, bending vibrations are generated around a rotational axis defined in parallel to the center axis. The vibrations are transmitted from the base section to the base unit through the supporting unit. The vibrations are attenuated to some extent in the base unit because the base unit is held between the lower side substrate and the upper side substrate.

SUMMARY OF THE INVENTION

The inventors of the present invention have discovered that the above-mentioned attenuation of the vibrations distorts resonance waveforms and shifts the resonant frequency in the case where vibration amplitude of the vibration arms is large. The shift in resonant frequency needs to be improved because of its large influence on resonance characteristics and phase noise.

Therefore, it is an object of the disclosure to provide a resonator with a suppressed shift in resonant frequency.

A resonator according to an exemplary aspect includes a vibration section that includes a plurality of vibration arms each having a fixed end and an open or free end, at least two vibration arms of which perform out-of-plane bend with different phases, and a base section having a front end connected to the fixed end of each of the plurality of vibration arms and a rear end opposing the front end. Moreover the rear end of the base sections is configured to bend, when the vibration arms perform the out-of-plane bend, in a direction of the out-of-plane bend while a portion between the two vibration arms performing the out-of-plane bend with different phases is taken as a node. Furthermore, the resonator includes a frame or holding unit provided in at least part of a periphery of the vibration section; and at least one holding arm that is provided between the vibration section and the holding unit, with one end of the holding arm being connected to the base section and the other end of the holding arm being connected to the holding unit. In an exemplary aspect, the at least one holding arm bends in the direction of the out-of-plane bend when the base section bends.

According to exemplary embodiments, a shift in resonant frequency can be suppressed in the exemplary resonator.

BRIEF DESCRIPTION OF DRAWINGS

FIG. 17 corresponds to FIG. 3.

DETAILED DESCRIPTION OF EXEMPLARY EMBODIMENTS

First Embodiment

Figure 1:
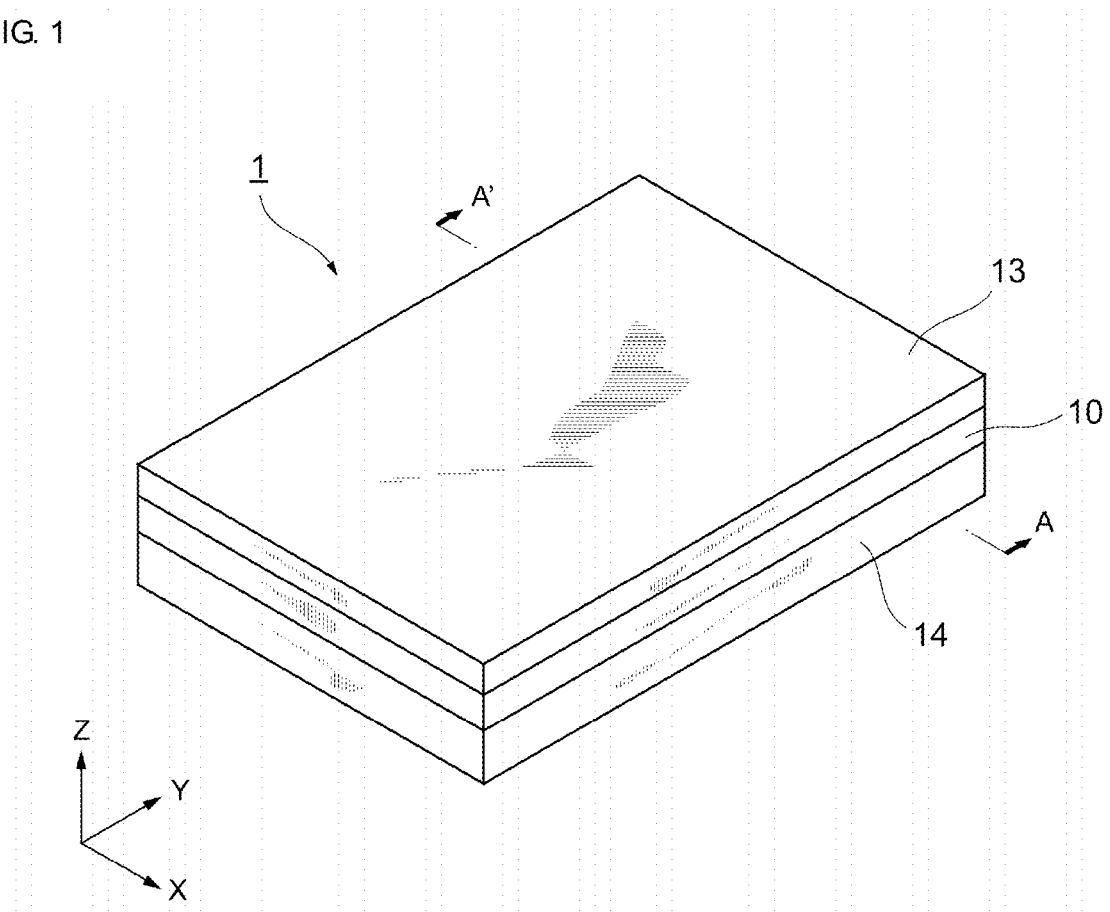
FIG. 1 is a perspective view schematically illustrating an external appearance of a resonance device according to a first exemplary embodiment.
Figure 2:
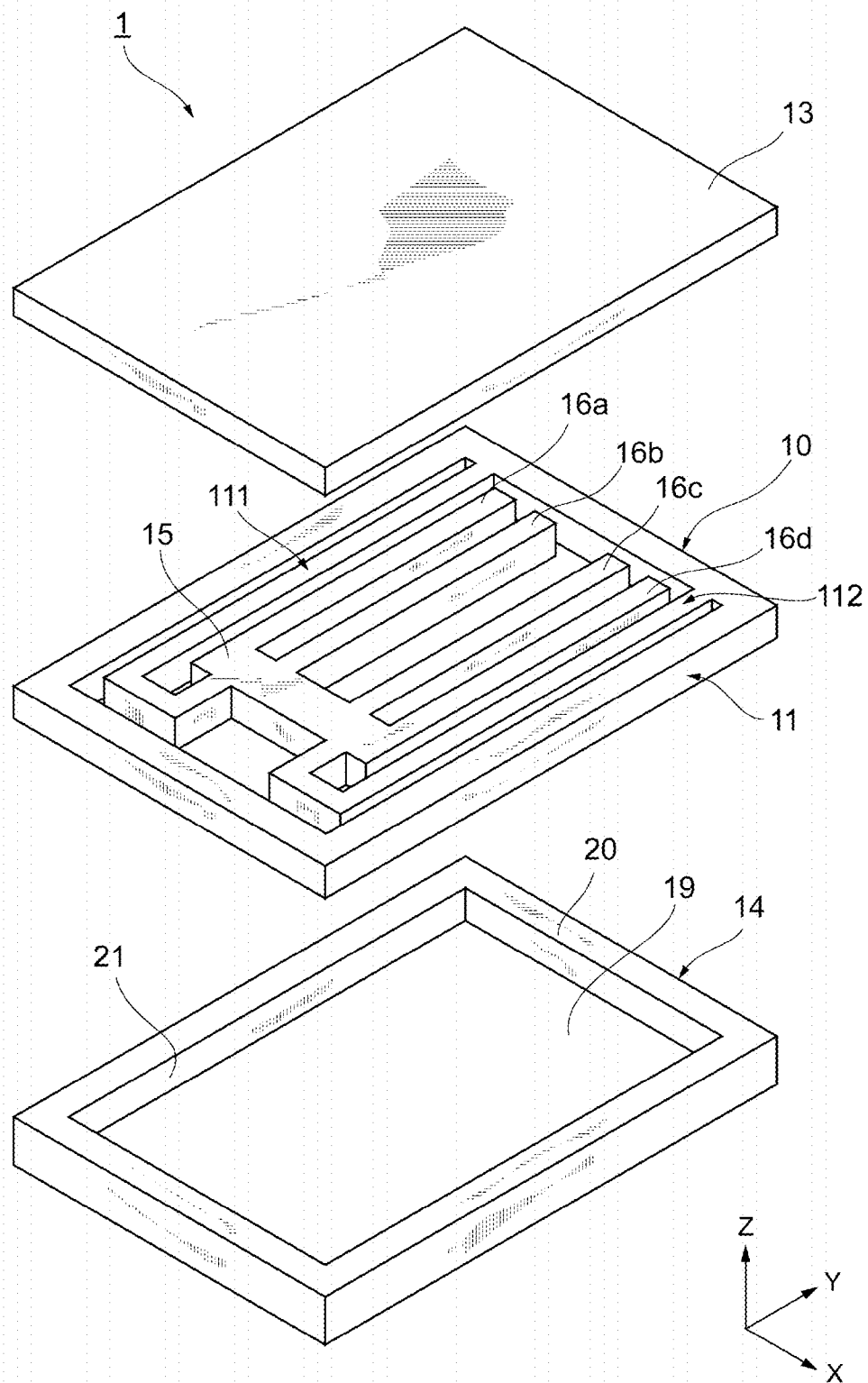
FIG. 2 is an exploded perspective view schematically illustrating a structure of the resonance device according to the first exemplary embodiment.
Figure 3:
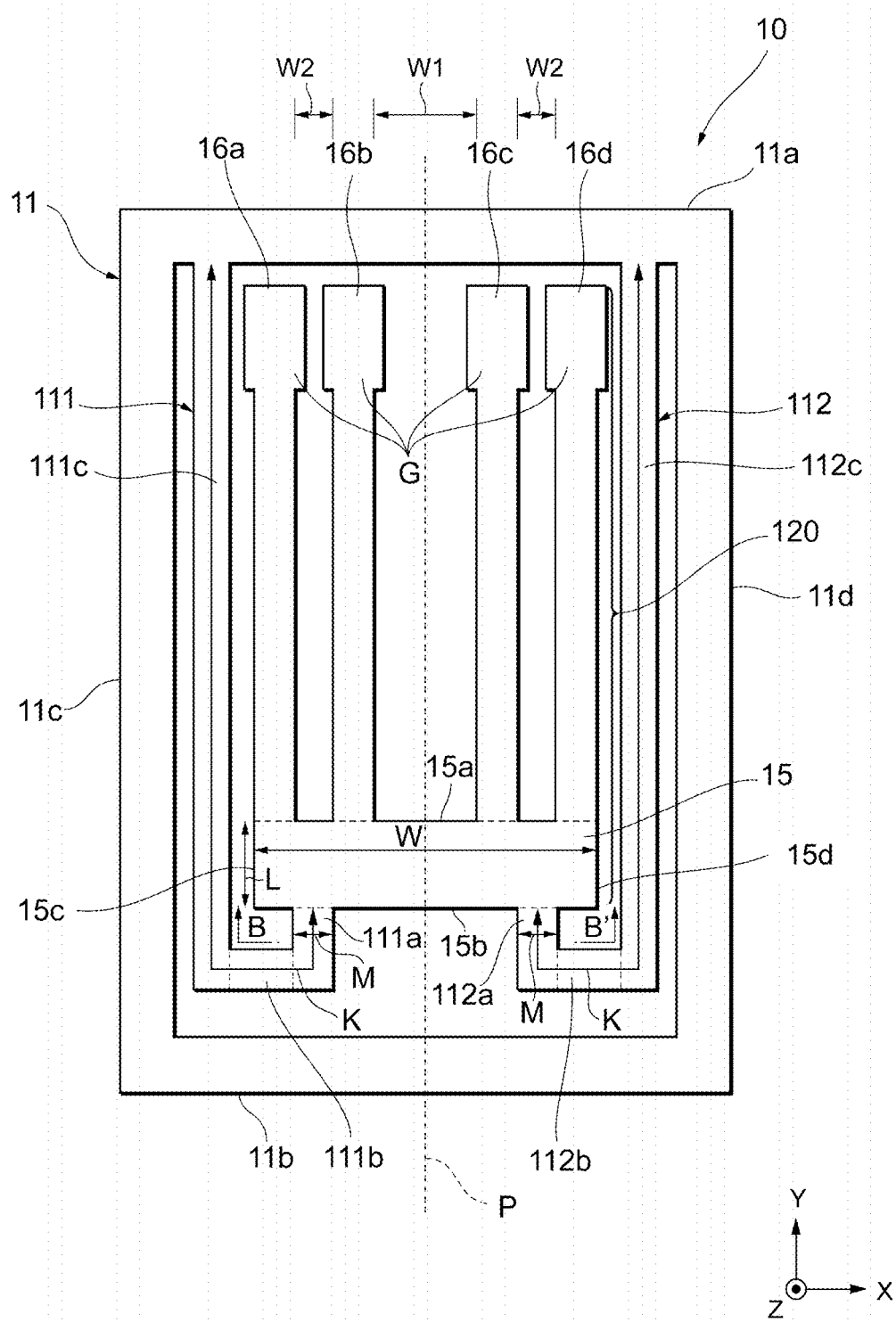
FIG. 3 is a plan view of a resonator according to the first exemplary embodiment in which an upper side substrate is detached.

Hereinafter, a first exemplary embodiment will be described with reference to the accompanying drawings. FIG. 1 is a perspective view schematically illustrating an external appearance of a resonance device 1 according to the first embodiment of the present invention. FIG. 2 is an exploded perspective view schematically illustrating a structure of the resonance device 1 according to the first embodiment of the present invention. FIG. 3 is a cross-sectional view taken along an A-A' line in FIG. 1.

The resonance device 1 is provided with a resonator 10, and an upper cover 13 and a lower cover 14 configured to sandwich and seal the resonator 10 therebetween and form a vibration space in which the resonator 10 vibrates. The resonance device 1 is configured such that the lower cover 14, the resonator 10, and the upper cover 13 are laminated in that order and bonded to each other.

According to the exemplary aspect, the resonator 10 is a MEMS resonator manufactured using the MEMS technique.

Moreover, the resonator 10 and the upper cover 13 are bonded so that the vibration space for the resonator 10 is formed and the resonator 10 is sealed. The resonator 10, the upper cover 13, and the lower cover 14 are each formed using a Si substrate. As such, the vibration space for the resonator 10 is formed by the Si substrates being bonded to each other. The resonator 10 and the lower cover 14 may be formed using an SOI substrate.

Hereinafter, constituent elements of the resonance device 1 will be described in detail.

(1. Upper Cover 13)

FIG. 2 is an exploded perspective view schematically illustrating the structure of the resonance device 1 according to the first exemplary embodiment. The upper cover 13 extends in the form of a plate along an XY plane, and a shallow recess having a rectangular parallelepiped shape is formed in a rear surface of the upper cover 13, for example. The recess forms part of the vibration space for the resonator 10.

(2. Lower Cover 14)

The lower cover 14 includes a bottom plate 19 formed in a rectangular plate shape and provided along the XY plane, and a side wall 20 extending in a Z axis direction from a circumference portion of the bottom plate 19. An inner surface of the lower cover 14, in other words, a surface of the bottom plate 19 and an inner surface of the side wall 20 form a recess 21. The recess 21 forms part of the vibration space for the resonator 10.

The vibration space is air-tightly sealed by the above-discussed upper cover 13 and lower cover 14 so that a vacuum state is maintained therein. The vibration space may be filled with gas such as an inactive gas or the like.

(3. Resonator 10)

FIG. 3 is a plan view schematically illustrating a structure of the resonator 10 according to the present embodiment. Constituent elements of the resonator 10 according to the present embodiment will be described with reference to FIG. 3. The resonator 10 is provided with a vibration section 120, a holding unit 11, and holding arms 111, 112.

(a) Vibration Section 120

The vibration section 120 has a plate-like contour extending like a plate along the XY plane in an orthogonal coordinate system shown in FIG. 3. The vibration section 120 is provided in an inner side portion of the holding unit 11, and a space is formed at a predetermined interval between the vibration section 120 and the holding unit 11. In an example of FIG. 3, the vibration section 120 includes a base section 15 and four vibration arms 16a to 16d. The number of vibration arms is not limited to four, and is set to a number no less than three, for example.

According to an exemplary aspect, the base or base section 15 (the terms are used interchangeably) is a substantially rectangular parallelepiped plate that includes long sides 15a, 15b in an X axis direction and short sides 15c, 15d in the Y axis direction, and bends in a bending direction (Z axis direction in FIG. 3), when the vibration arms 16a to 16d bend, taking a portion between two vibration arms performing out-of-plane bend with different phases as a node. The base section 15 is not limited to a substantially rectangular parallelepiped shape, and it is sufficient for the base section 15 to be formed in a substantially plane-symmetrical shape with respect to a plane defined along a perpendicular bisector of the long side 15a. The shape of the base section 15 may be, for example, a trapezoid in which the long side 15b is shorter than the long side 15a, a semicircle taking the long side 15a as a diameter, or the like. Further, the long sides 15a, 15b and the short sides 15c, 15d are not limited to straight lines, and may be curved lines. It is noted that the term "substantially" takes into account minor variations in the dimensions that may occur as a result of the manufacturing process as would be appreciated to one skilled in the art, for example.

In the example of FIG. 3, the base section 15 is connected to the holding unit 11 at the long side 15b with the holding arms 111 and 112, to be explained later, so as to be held.

The shape of the base section 15 will be described in detail below. In a lengthwise direction, that is, a direction extending from a front end of the base section 15 (a point on the long side 15a in FIG. 3) toward a rear end thereof (a point on the long side 15b in FIG. 3), the longest distance between the front end and the rear end is defined as a base section length L; in a width direction orthogonal to the lengthwise direction, the longest distance between a left end of the base section 15 (short side 15c in FIG. 3) and a right end thereof (short side 15d in FIG. 3) is defined as a base section width W. In the present embodiment, since the base section 15 is rectangular, the base section width W is the same as the length of the long sides 15a and 15b, and the base section length L is the same as the length of the short sides 15c and 15d. In the case where the base section 15 has a shape that is so set as to satisfy a relation of $L/W \leq 0.3$, the base section 15 is likely to bend in the Z axis direction. It is more preferable for the base section length L to be no more than 80 μm. Further, it is preferable in the base section 15 that thicknesses of the vibration arms 16a to 16d along the bending direction (Z axis direction) be no more than 10 µm. It is more preferable for the thickness of the base section to be 6 µm.

The vibration arms 16a to 16d are respectively provided between the base section 15 and the holding unit 11 in parallel to the Y axis direction. Moreover, one end of each of the arms is connected to one long side, that is, the long side 15a of the base section 15 so as to become a fixed end, and the other end thereof becomes an open end. In the present embodiment, the vibration arms 16a to 16d are integrally formed with the base section 15. Further, the vibration arms 16a to 16d are each formed in a rectangular column shape extending in the Y axis direction and have the same size. The width of the vibration arms 16a to 16d in the X axis direction is approximately 50 µm and the length thereof in the Y axis direction is approximately 450 µm, for example.

Further, each of the vibration arms 16a to 16d has a weight G at its free end. The weight G has a wider width in the X axis direction than other sections of the vibration arms 16a to 16d. The width of the weight G in the X axis direction is, for example, approximately 70 µm. The weight G is integrally formed with the vibration arms 16a to 16d through the same process, for example. By the weight G being formed, a weight per unit length of the vibration arms 16a to 16d is heavier on the free end side than the fixed end side. As such, by each of the vibration arms 16a to 16d having the weight G on the free end side, vibration amplitude in an up-down direction of each vibration arm can be made larger.

As shown in FIG. 3, in the vibration section 120 of the present embodiment, two vibration arms 16a and 16d are disposed in an outer side portion thereof in the X axis direction, and two vibration arms 16b and 16c are disposed in an inner side portion thereof in the X axis direction. An interval W1 between the vibration arms 16b and 16c in the X axis direction is set to be larger than an interval W2 between the vibration arm 16a (16d) in the outer side portion and the vibration arm 16b (16c) in the inner side portion, the vibration arm 16b (16c) being adjacent to the vibration arm 16a (16d) in the outer side portion in the X axis direction. The interval W1 is approximately 25 and the interval W2 is approximately 10 for example. Vibration characteristics are improved by setting the interval W2 to be smaller than the interval W1. In order to miniaturize the resonance device 1, the interval W2 may be set to be smaller than the interval W2 or the intervals W1 and W2 may be set to be equal to each other.

(B) Holding Unit 11

The frame or holding unit 11 (the terms are used interchangeably) is formed in a rectangular frame shape along the XY plane. The holding unit 11 is so provided as to surround the outer side portion of the vibration section 120 along the XY plane. It is sufficient for the holding unit 11 to be provided in at least part of the periphery of the vibration section 120, and the holding unit 11 is not limited to a frame shape. In the present embodiment, the holding unit 11 is made of frame bodies 11a to 11d each formed in a rectangular column shape. The frame bodies 11a to 11d are integrally formed.

The frame body 11a (an example of a first fixed portion) is provided opposing the free ends of the vibration arms 16a to 16d in the X axis direction. The frame body 11b is provided opposing the long side 15b of the base section 15 in the X axis direction. The frame body 11c (an example of a second fixed portion) is provided opposing the long side of the vibration arm 16a in the Y axis direction, and both ends thereof are respectively connected to one ends of the frame bodies 11a and 11b. The frame body 11d (an example of the second fixed portion) is provided opposing the long side of the vibration arm 16d in the Y axis direction, and both ends thereof are respectively connected to the other ends of the frame bodies 11a and 11b.

In the following explanation, the frame body 11a side will be described as the upper side of the resonator 10, while the frame body 11b side will be described as the lower side of the resonator 10.

(c) Holding Arms 111 and 112

The holding arm 111 and the holding arm 112 are provided in an inner side portion of the holding unit 11, and connect the long side 15b of the base section 15 and the frame body 11a. As shown in FIG. 3, the holding arm 111 and the holding arm 112 are formed to be substantially plane-symmetric with respect to an imaginary plane P defined in parallel to a YZ plane along a center line in the X axis direction of the base section 15. The holding arms 111 and 112 bend, when the base section 15 bends, in the bending direction of the vibration arms 16a to 16d (Z axis direction in FIG. 3).

The holding arm 111 includes arms 111a, 111b, and 111c. One end of the holding arm 111 is connected to the long side 15b of the base section 15, and the holding arm 111 extends therefrom toward the frame body 11b. Then, the holding arm 111 bends in a direction extending toward the frame body 11c (that is, the X axis direction), and further bends in a direction extending toward the frame body 11a (that is, the Y axis direction) so that the other end thereof is connected to the frame body 11a.

The arm 111a is provided, between the base section 15 and the frame body 11b, opposing the frame body 11c so that the lengthwise direction thereof is parallel to the Y axis. One end of the arm 111a (i.e., a first end) is connected to the base section 15 at the long side 15b of the base section 15, and the arm 111a extends therefrom in a direction substantially perpendicular to the long side 15b, that is, in the Y axis direction. It is preferable that an axis passing through the center in the X axis direction of the arm 111a be provided on an inner side portion relative to the center line of the vibration arm 16a. In the example of FIG. 3, the arm 111a is provided between the vibration arms 16a and 16b. Details of a preferable connection position between the holding arm 111 and the base section 15 will be explained later with reference to FIG. 6.

The other end of the arm 111a (i.e., a second end) is connected to one end of the arm 111b at a side surface thereof. The width of the arm 111a defined in the X axis direction is approximately 20 µm, and the length thereof defined in the Y axis direction is 40 µm.

As shown, the arm 111b is provided, between the base section 15 and the frame body 11b, opposing the frame body 11b so that the lengthwise direction thereof is parallel to the X axis direction. The one end of the arm 111b is connected to the side surface which is the other end of the arm 111a and is positioned on a side opposing the frame body 11c, and the arm 111b extends therefrom in a direction substantially perpendicular to the arm 111a, that is, in the X axis direction. The other end of the arm 111b is connected to a side surface which is one end of the arm 111c and is positioned on a side opposing the vibration section 120. According to an exemplary aspect, the width of the arm 111b defined in the Y axis direction is approximately 20 µm, and the length thereof defined in the X axis direction is approximately 75 µm, for example.

The arm 111c is provided, between the base section 15 and the frame body 11c, opposing the frame body 11c so that the lengthwise direction thereof is parallel to the Y axis direction.

The one end of the arm 111c is connected to the other end of the arm 111b at the side surface thereof. The other end of the arm 111c is connected to the frame body 11a at a position in an outer side portion relative to a position opposing the vibration section 120, and the arm 111c extends therefrom in a direction substantially perpendicular to the frame body 11a, that is, in the Y axis direction.

The width of the arm 111c defined in the X axis direction is approximately 20 μm, and the length thereof defined in the Y axis direction is approximately 680 μm, for example.

As described above, the holding arm 111 is configured to be connected to the base section 15 with the arm 111a, be bent at a connection portion between the arm 111a and the arm 111b and at a connection portion between the arms 111b and 111c, then be connected to the holding unit 11.

Definitions of a holding arm width M and a holding arm length K will be described below. The holding arm width M refers to the length of a side parallel to the rear end of the base section 15 (long side 15b) in an end surface of the one end of the arm 111a (a contact surface with the base section 15).

Meanwhile, when an imaginary arm is assumed in which end surfaces of the arms from one end of the holding arm 111 (that is, the one end of the arm 111a) to the other end of the holding arm 111 (that is, the other end of the arm 111c) are connected to each another and then the respective arms are aligned straight, the holding arm length K refers to the length of a straight line connecting the center of the end surface of the one end and the center of the end surface of the other end. In this case, the end surfaces of each arm refer to, in the case of the arm 111a, a connection surface with the base section 15 and the end surface of the other end. Moreover, for the arm 111b, the end surfaces thereof refer to the respective connection surfaces with the arm 111a and the arm 111c; and for the arm 111c, the end surfaces thereof refer to the end surface of the one end and the connection surface with the frame body 11a. Further, the center of the end surface refers to a middle point or the center of gravity thereof.

More particularly, the holding arm length K in the exemplary embodiment refers to a total sum of the shortest distance between the centers of the end surfaces of the one end of the arm 111a and the other end thereof (the connection surface with the base section 15 and the end surface of the other end), the shortest distance between the centers of the end surfaces of the one end of the arm 111b and the other end thereof (a connection surface with the arm 111a and a connection surface with the arm 111c), and the shortest distance between the centers of the end surfaces of the one end of the arm 111c and the other end thereof (the end surface of the one end and a connection surface with the frame body 11a).

At this time, in the case where the holding arm 111 is formed in a shape in which a relation of K/M 6 is set, the stated arm is likely to bend in the Z axis direction. It is more preferable in this case for the holding arm length K to be no less than 150 μm.

The holding arm 112 includes arms 112a, 112b, and 112c. One end of the holding arm 112 is connected to the long side 15b of the base section 15, and the holding arm 112 extends therefrom toward the frame body 11b. Then, the holding arm 112 bends in a direction extending toward the frame body 11d (that is, the X axis direction), and further bends in the direction extending toward the frame body 11a (that is, the Y axis direction) so that the other end thereof is connected to the frame body 11a.

The arm 112a is provided, between the base section 15 and the frame body 11b, opposing the frame body 11d so that the lengthwise direction thereof is parallel to the Y axis. One end of the arm 112a is connected to the base section 15 at the long side 15b of the base section 15, and the arm 112a extends therefrom in the direction substantially perpendicular to the long side 15b, that is, in the Y axis direction. It is preferable that an axis passing through the center in the X axis direction of the arm 112a be provided at a position on an inner side portion relative to the center line of the vibration arm 16d. In the example of FIG. 3, the arm 112a is provided between the vibration arms 16c and 16d. Details of a preferable connection position between the holding arm 112 and the base section 15 will be explained later with reference to FIG. 6.

The other end of the arm 112a is connected to one end of the arm 112b at a side surface thereof. The width of the arm 112a defined in the X axis direction is approximately 20 μm, and the length thereof defined in the Y axis direction is 40 μm.

The arm 112b is provided, between the base section 15 and the frame body 11b, opposing the frame body 11b so that the lengthwise direction thereof is parallel to the X axis direction. One end of the arm 112b is connected to the side surface which is the other end of the arm 112a and is positioned on a side opposing the frame body 11d, and the arm 112b extends therefrom in a direction substantially perpendicular to the arm 112a, that is, in the X axis direction. The other end of the arm 112b is connected to a side surface which is one end of the arm 112c and is positioned on a side opposing the vibration section 120. The width of the arm 112b defined in the Y axis direction is approximately 20 μm, and the length thereof defined in the X axis direction is approximately 75 μm, for example.

The arm 112c is provided, between the base section 15 and the frame body 11d, opposing the frame body 11d so that the lengthwise direction thereof is parallel to the Y axis direction.

The one end of the arm 112c is connected to the other end of the arm 112b at the side surface thereof. The other end of the arm 112c is connected to the frame body 11a at a position in an outer side portion relative to a position opposing the vibration section 120, and the arm 112c extends therefrom in the direction substantially perpendicular to the frame body 11a, that is, in the Y axis direction.

The width of the arm 112c defined in the X axis direction is approximately 20 μm, and the length thereof defined in the Y axis direction is approximately 680 μm, for example.

Because the holding arm 112 has a shape likely to bend, a preferable ratio of the holding arm length K to the holding arm width M is the same as that of the holding arm 111 according to the exemplary embodiment.

As described above, the holding arm 112 is configured to be connected to the base section 15 with the arm 112a, be bent at a connection portion between the arm 112a and the arm 112b and at a connection portion between the arms 112b and 112c, then be connected to the holding unit 11.

(4. Lamination Structure)

Figure 4:
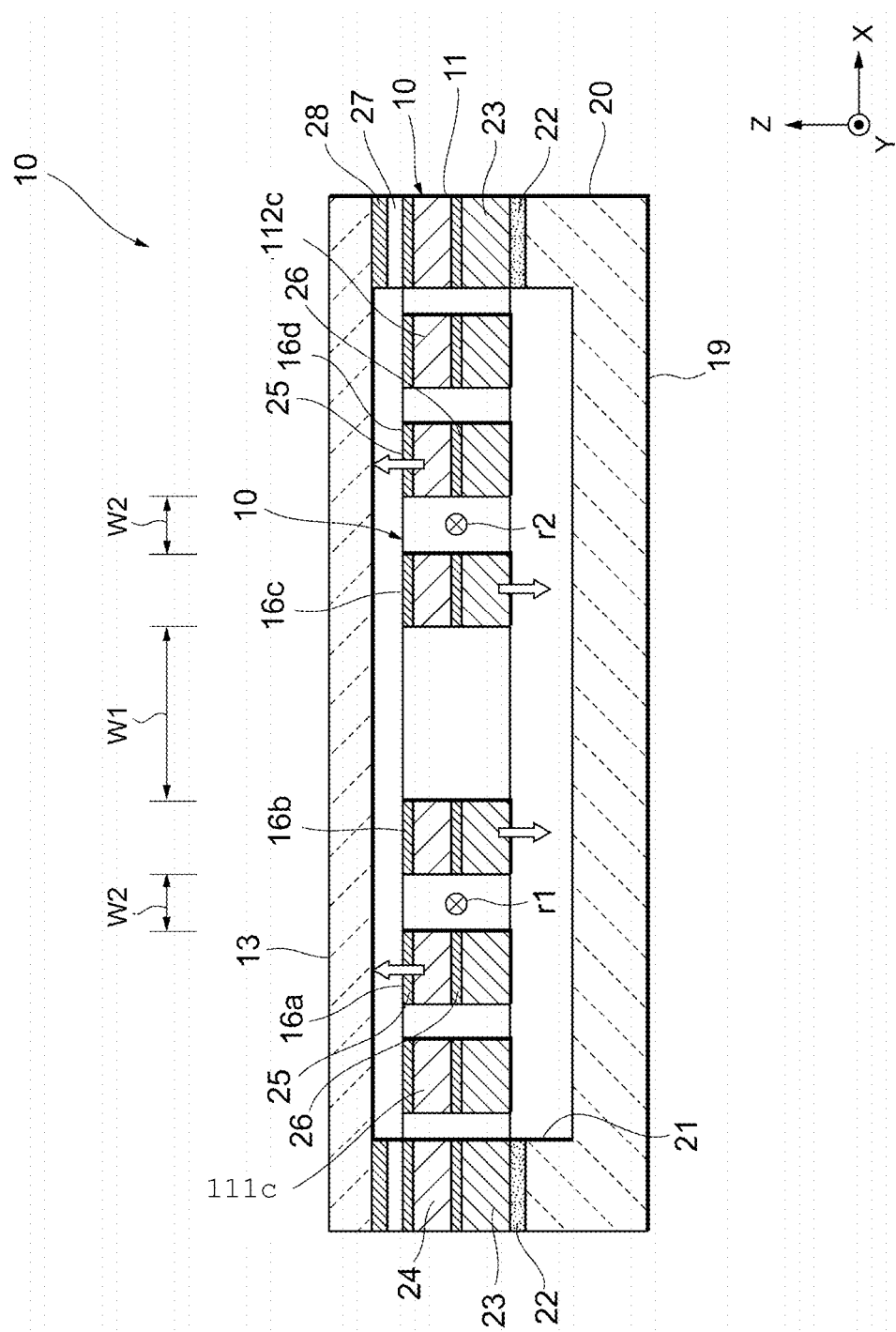
FIG. 4 is a cross-sectional view taken along an A-A' line in FIG. 1.

A lamination structure of the resonance device 1 will be described with reference to FIG. 4. FIG. 4 is a cross-sectional view taken along an A-A' line in FIG. 1.

As shown in FIG. 4, in the resonance device 1 according to the present embodiment, the holding unit 11 of the resonator 10 is bonded on the side wall 20 of the lower cover 14, and further the upper cover 13 is bonded on the resonator 10 so as to cover the resonator 10. In this manner, the resonator 10 is held between the lower cover 14 and the upper cover 13, and a vibration space in which the vibration arms 16a to 16d vibrate is formed by the lower cover 14, the upper cover 13, and the holding unit 11 of the resonator 10.

The bottom plate 19 and the side wall 20 of the lower cover 14 are integrally formed with Si (Silicon). A $SiO_2$ (silicon dioxide) film 22 is formed on the upper surface of the side wall 20 so that the lower cover 14 and the holding unit 11 of the resonator 10 are bonded with the stated $SiO_2$ film 22. The thickness of the lower cover 14 defined in the Z axis direction is 150 μm, for example, and the depth of the recess 21 is 50 μm, for example.

The upper cover 13 is formed with a Si (silicon) wafer having a predetermined thickness. As further shown in FIG. 4, the upper cover 13 is bonded to the holding unit 11 of the resonator 10 in the periphery thereof. In order to bond the upper cover 13 and the holding unit 11, an Au (gold) film 27 and an Sn (tin) film 28, for example, are formed between a circumference portion of the upper cover 13 and the holding unit 11.

In the resonator 10, the holding unit 11, the base section 15, the vibration arms 16a to 16d, and the holding arms 111 and 112 are formed through the same process. In the resonator 10, a metal layer 26 is laminated first on a Si (silicon) layer 23. Then, a piezoelectric thin film 24 is laminated on the metal layer 26 so as to cover the metal layer 26, and further a metal layer 25 is laminated on the piezoelectric thin film 24.

The Si layer 23 is formed with, for example, a degenerate n-type Si semiconductor having a thickness of approximately 5 μm, and is capable of containing P (phosphorus), As (arsenic), Sb (antimony), or the like as n-type dopant. It is preferable for a resistance value of the degenerate Si used in the Si layer 23 to be no less than 0.5 mΩ·cm and no more than 0.9 mΩ·cm. The resistance value of the degenerate Si used in the present embodiment is 0.63 mΩ·cm, for example. A $SiO_2$ layer may be formed on a lower surface of the Si layer 23. In this case, temperature characteristics can be improved.

The metal layers 25 and 26 are each formed using Mo (molybdenum), aluminum (Al), or the like having a thickness of approximately 0.1 μm, for example. Without forming the metal layer 26, the Si layer 23, which is a degenerate semiconductor, may be used as the metal layer 26.

The metal layers 25 and 26, after having been laminated in the resonator 10, are so formed as to have a desired shape by processing such as etching or the like.

The metal layer 26 is processed by etching or the like so as to become a lower-portion electrode on the vibration section 120, for example. Further, on the holding arms 111 and 112, the holding unit 11, or the like, the metal layer 26 is processed by etching or the like so as to become wiring for connecting the lower-portion electrode to an AC power supply provided outside the resonator 10, for example.

Meanwhile, the metal layer 25 is processed by etching or the like so as to become an upper-portion electrode on the vibration section 120, for example. Further, on the holding arms 111 and 112, the holding unit 11, or the like, the metal layer 25 is processed by etching or the like so as to become wiring for connecting the upper-portion electrode to the AC power supply provided outside the resonator 10, for example.

In the case where the AC power supply is connected to lower-portion wiring or upper-portion wiring, a configuration in which an electrode is formed on an outer surface of the upper cover 13 and the stated electrode connects the AC power supply and the lower-portion or upper-portion wiring, a configuration in which a via is formed inside the upper cover 13, the interior of the via is filled with a conductive material to form wiring, and the stated wiring connects the AC power supply and the lower-portion or upper-portion wiring, or the like may be used.

The piezoelectric thin film 24 is a thin film made of piezoelectric material configured to transform an applied voltage to vibrations, and is capable of containing nitride such as AlN (aluminum nitride), oxides, or the like as a major ingredient, for example. Specifically, a piezoelectric thin film 24 can be formed with ScAlN (scandium aluminum nitride). ScAlN is formed by replacing part of aluminum in aluminum nitride with scandium. The piezoelectric thin film 24 has a thickness of 1 μm, for example.

The piezoelectric thin film 24 expands/contracts in an in-plane direction of the XY plane, that is, in the Y axis direction, in accordance with an electric field applied to the piezoelectric thin film 24 by the metal layers 25 and 26. With the expansion/contraction of the piezoelectric thin film 24, the vibration arms 16a to 16d displace the free ends thereof toward the inner surfaces of the lower cover 14 and the upper cover 13, thereby vibrating in the out-of-plane bending vibration mode.

In the present embodiment, as shown in FIG. 4, a phase of an electric field applied to the vibration arms 16a and 16d in the outer side portion and a phase of an electric field applied to the vibration arms 16b and 16c in the inner side portion are set to be reverse to each other. This causes the vibration arms 16a and 16d in the outer side portion and the vibration arms 16b and 16c in the inner side portion to be displaced in reverse directions to each other. For example, in the case where the vibration arms 16a and 16d in the outer side portion displace the free ends thereof toward the inner surface of the upper cover 13, the vibration arms 16b and 16c in the inner side portion displace the free ends thereof toward the inner surface of the lower cover 14.

In the above-discussed exemplary resonance device 1, during the vibrations with reverse phases, that is, around a center axis r1 extending in parallel to the Y axis between the vibration arm 16a and the vibration arm 16b as shown in FIG. 4, the vibration arm 16a and the vibration arm 16b vibrate reversely to each other in the up-down direction. Further, around a center axis r2 extending in parallel to the Y axis between the vibration arm 16c and the vibration arm 16d, the vibration arm 16c and the vibration arm 16d vibrate being reverse to each other in the up-down direction. This generates torsional moment around each of the center axes r1 and r2 in the reverse directions to each other, resulting in the generation of bending vibrations in the base section 15.

FIGS. 5(A) to 5(C) are diagrams schematically illustrating distribution of displacement amounts brought by the vibrations of the resonator 10 in the present embodiment. In FIGS. 5(A) to 5(C), a portion of dark color represents a section where the displacement is large in comparison with a portion of light color.

Figure 5:
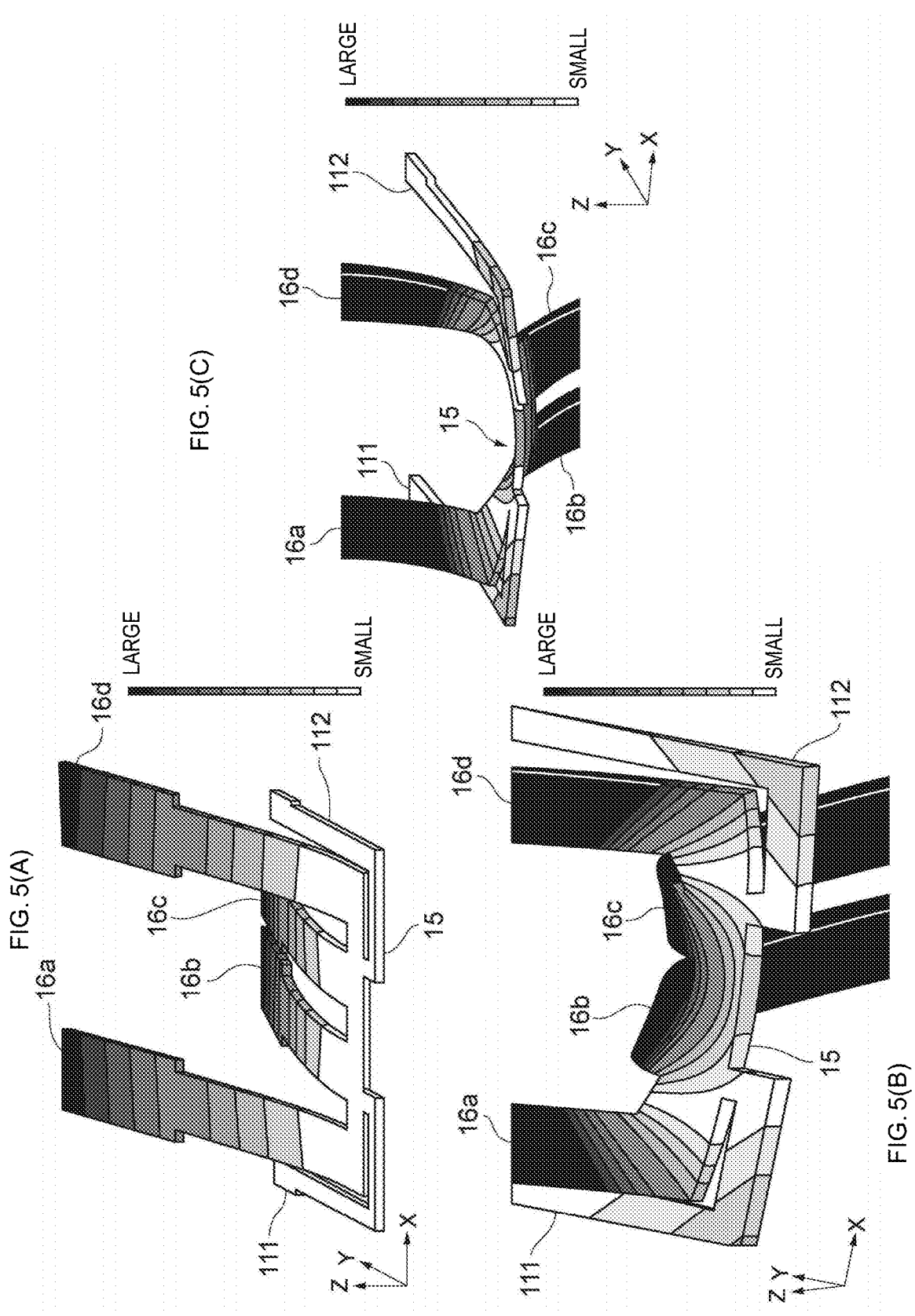
FIGS. 5(a) to 5(c) illustrate diagrams illustrating distribution of displacement amounts of vibrations of the resonator according to the first exemplary embodiment.

FIG. 5(B) is a diagram enlarging the base section 15 of FIG. 5(A). As shown in FIG. 5(B), it can be understood that the base section 15 bends, when the vibration arms 16a to 16d perform out-of-plane bend, in the out-of-plane bend direction of the vibration arms 16a to 16d (Z axis direction in FIG. 5) while a portion between the vibration arms 16a and 16b performing the out-of-plane bend with different phases from each other and a portion between the vibration arms 16c and 16d performing the out-of-plane bend with different phases from each other are taken as nodes.

FIG. 5(C) is a diagram enlarging the holding arms 111 and 112 of FIG. 5(A). As shown in FIGS. 5(B) and 5(C), it can be understood that the holding arms 111 and 112 bend in the out-of-plane bend direction (Z axis direction in FIG. 5) of the vibration arms 16a to 16d in accordance with the bend of the base section 15.

Figure 6:
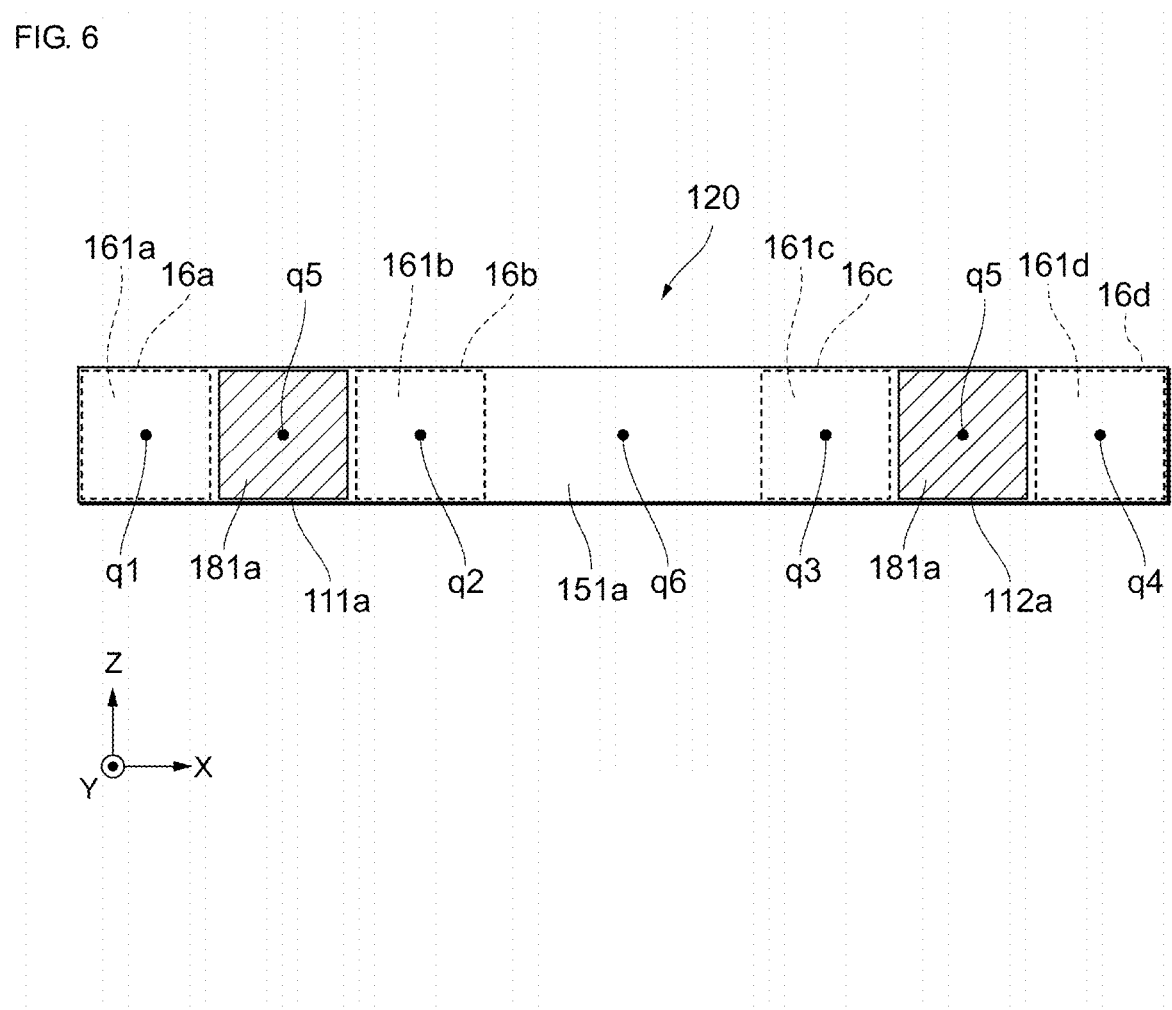
FIG. 6 is a cross-sectional view taken along a B-B' line in FIG. 3.

Next, with reference to FIGS. 6 and 7, the connection positions between the holding arms 111, 112 and the base section 15 will be described. FIG. 6 is a cross-sectional view taken along a B-B' line in FIG. 3.

In FIG. 6, surfaces 161a to 161d indicated by dotted lines are imaginary end surfaces representing surfaces at which the vibration arms 16a to 16d make contact with the end surface of the front end of the base section 15 (or surfaces to become boundaries). Surfaces 181a are imaginary end surfaces of the arms 111a and 112a representing surfaces at which the arms 111a and 112a of the holding arms 111 and 112 make contact with the end surface of the rear end of the base section 15 (or surfaces to become boundaries). Further, a surface 151a is a contact surface (front end surface) of the base section 15 with the surfaces 161a to 161d of the vibration arms 16a to 16d. Points q1 to q4 respectively indicate centers of the end surfaces 161a to 161d, points q5 indicate centers of the end surfaces 181a, and a point q6 indicates a center of the front end surface 151a. It is noted that the center of a surface refers to the middle of the surface, the center of gravity thereof, or the like, for example. Moreover, it is sufficient for the center of a surface to be at least the middle in the X axis direction of the stated surface.

As shown in FIG. 6, the center points q5 of the end surfaces 181a of the holding arms 111 and 112 are positioned, in the most outer side portion of the base section 15, on a side of the vibration arms 16b and 16c in the inner side portion relative to the center points q1 and q4 of the end surfaces 161a and 161d of the vibration arms 16a and 16d connected to the base section 15. It is preferable that the holding arms 111 and 112 be connected to the base section 15 such that a distance from the center point q5 to the center point q6 of the front end surface 151a becomes no more than 0.6 times half of the base section width W. In the present embodiment, since the base section 15 is rectangular, the base section width corresponds to the length of the long side 15a. In this case, DLD (Drive Level Dependency: excitation level dependency characteristics) of the resonator 10 can be improved. It is more preferable that the one ends of the holding arms 111 and 112 be connected to the base section 15 in a region where the displacement of vibrations of the base section 15 becomes minimum. In this case, a variation in vibration frequency of the resonator 10 can be reduced.

Figure 7:
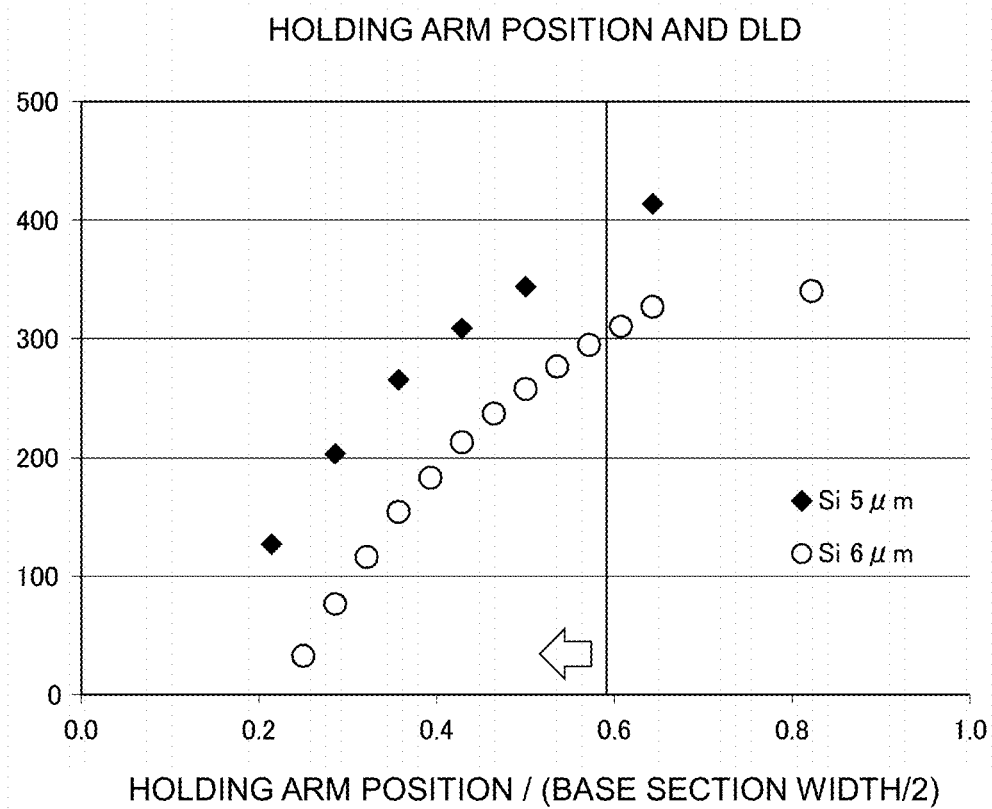
FIG. 7 is a graph showing a relationship between DLD and a connection position of a holding arm with respect to a base section.

FIG. 7 is a graph showing a change in DLD with respect to the connection positions between the holding arms 111, 112 and the base section 15. The horizontal axis represents the ratio of a distance from the center point q5 to the center point q6 to a value of half the base section width, while the vertical axis represents the frequency displacement amount (ppm) per unit power (μW). In an example of FIG. 7, a resonant frequency was first measured using an impedance analyzer or the like while changing input power (μW). Thereafter, linear approximation was performed on the relationship between the input power and the resonant frequency having been measured, and a slope of the straight line (the resonant frequency change amount with respect to the input power change amount) was taken as a frequency displacement amount per unit power.

As shown in FIG. 7, the amount of DLD change is considerably improved in a region where the ratio of the distance from the center point q5 to the center point q6 to the value of half the base section width is no more than 0.6.

As shown in FIG. 7, although the DLD is substantially constant when the ratio of the distance from the center point q5 to the center point q6 to the value of half the base section width is greater than 0.6, the DLD progressively decreases taking the point of 0.6 as a boundary. It can be understood that the DLD is considerably improved by setting the ratio of the distance from the center point q5 to the center point q6 to the value of half the base section width to be no more than 0.6.

Further, in the resonance device 1 according to the present embodiment, by connecting the base section 15 and the holding arms 111, 112 at the long side 15b opposing the long side 15a to which the vibration arms 16a to 16d are connected, vibration leakage can be suppressed and a Q-value is enhanced. Moreover, by setting a connection point with each of the holding arms 111 and 112 in a section of the long side 15b where the displacement due to the vibrations is small, or preferably smallest compared to other sections, the vibration characteristics can be more improved. To be specific, it is preferable that the holding arms 111 and 112 be connected to the long side 15b such that the axes of the arms 111a and 112a passing through the center of the X axis direction match the center axes r1 and r2.

It is preferable for the length L of the base section 15 to be larger than the arm width of the holding arms 111 and 112, particularly the arms 111a and 112a. This is because, in the case where the length L of the base section 15 is smaller than the width of the holding arms 111 and 112, the holding arms 111 and 112 have a larger influence so that the base section 15 becomes unlikely to bend.

Figure 8:
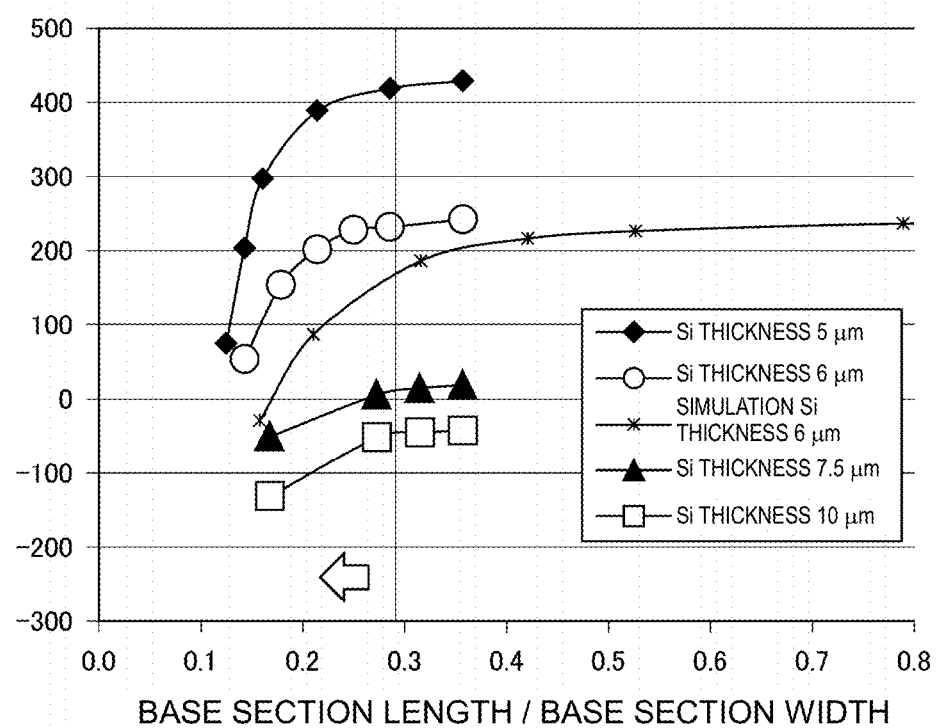
FIG. 8 is a diagram showing a correlation between DLD and a ratio of a length to a width of the base section according to the first exemplary embodiment.

FIG. 8 is a graph showing a result of verification in which the influence of a rate of the base section length L to the base section width W of the base section 15 on the DLD (Drive Level Dependency: excitation level dependency characteristics) was examined in the resonator 10 according to the present embodiment. The horizontal axis represents the rate of the base section length L to the base section width W of the base section 15, while the vertical axis represents the frequency displacement amount (ppm) per unit power (μW). In the verification, the result of which is shown in FIG. 8, the resonant frequency was first measured using an impedance analyzer or the like while changing the input power (μW). Thereafter, linear approximation was performed on the relationship between the input power and the resonant frequency having been measured, and a slope of the straight line (the resonant frequency change amount with respect to the input power change amount) was taken as a frequency displacement amount per unit power.

In the verification, the result of which is shown in FIG. 8, the DLD was actually measured in the cases where the thicknesses of the base section 15 were respectively 5 μm, 6 μm, 7.5 μm, and 10 μm in the resonator 10, while changing the base section length L from no less than 30 μm up to no more than 100 μm. In addition, in the case of the thickness of the base section 15 being 6 μm, the DLD change was also simulated while changing the base section length L from no less than 30 μm up to no more than 200 μm. In this verification, parameters other than the thickness of the base section 15 and the base section length L are as shown in a table below. It is noted that in the table below, a holding arm position represents the above-discussed distance from the center point q6 to the center point q5.

In the resonator 10 used in the verification, the holding arms 111 and 112 have shapes in such a manner as to be connected to the rear end (long side 15b) of the base section 15, and to the vicinity of the middle of each of the frame bodies 11c and 11d.

TABLE 1

| BASE SECTION THICKNESS | VIBRATION ARM LENGTH | VIBRATION ARM WIDTH | BASE SECTION LENGTH | BASE SECTION WIDTH | HOLDING ARM LENGTH | HOLDING ARM WIDTH | HOLDING ARM POSITION |
|---|---|---|---|---|---|---|---|
| 5 μm | 465 μm | 50 μm | 35-100 μm | 280 μm | 295-360 μm | 20 μm | 40 μm |
| 6 μm | | | | | | | |
| 7.5 μm | 465 μm | 40 μm | 30-100 μm | 240 μm | 200 μm | 20 μm | 70 μm |
| 10 μm | | | | | | | |
| 6 μm (SIMULATION) | 465 μm | 40 μm | 30-200 μm | 240 μm | 200 μm | 20 μm | 70 μm |

As shown in FIG. 8, although the DLD is substantially constant in the case where the base section length L is greater than 0.3 times the base section width W in any graph, the DLD progressively decreases taking the point of 0.3 times as a boundary. It can be understood that, by setting L and W so that the base section length L is no more than 0.3 times the base section width W in this manner, the DLD can be considerably improved. This makes it possible to further enhance the effect of a reduction in the frequency shift amount.

Figure 9:
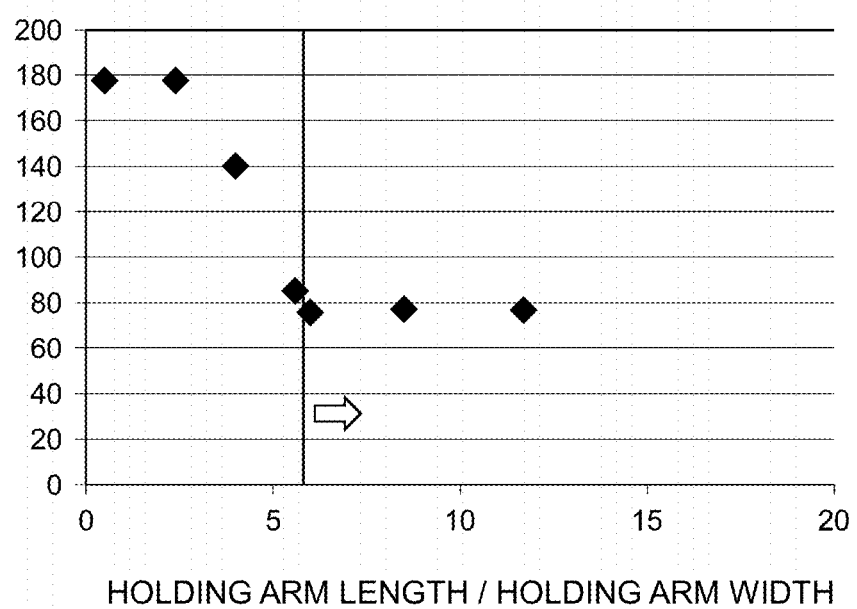
FIG. 9 is a diagram showing a correlation between DLD and a ratio of a length to a width of the holding arm according to the first exemplary embodiment.

FIG. 9 is a graph showing a result of verification in which the influence of a rate of the holding arm length K to the holding arm width M of the holding arms 111 and 112 on the DLD (Drive Level Dependency: excitation level dependency characteristics) was examined in the resonator 10 having the shape used in the verification of FIG. 8. The horizontal axis represents the rate of the holding arm length K to the holding arm width M, while the vertical axis represents the frequency displacement amount (ppm) per unit power (μW). The graph of FIG. 9 shows a result of the measurement of the DLD having been carried out by the same method as that of FIG. 8.

In the verification, the result of which is shown in FIG. 9, the DLD was actually measured while changing the holding arm length K from no less than 20 μm up to no more than 280 μm in the resonator 10 having the shape as illustrated in FIG. 3. In this verification, parameters other than the holding arm length K are as shown in a table below. It is noted that in table 2 below, the holding arm position represents the above-discussed distance from the center point q6 to the center point q5.

TABLE 2

| BASE SECTION THICKNESS | VIBRATION ARM LENGTH | VIBRATION ARM WIDTH | BASE SECTION LENGTH | BASE SECTION WIDTH | HOLDING ARM LENGTH | HOLDING ARM WIDTH | HOLDING ARM POSITION |
|---|---|---|---|---|---|---|---|
| 5 μm | 465 μm | 40 μm | 60 μm | 240 μm | 20-280 μm | 25 μm | 70 μm |

As shown in FIG. 9, when the holding arm length K is no less than four times the holding arm width M, the DLD is reduced and improved. Further, in the case where the holding arm length K is no less than six times the holding arm width M, the DLD is more improved. It can be understood that, by setting K and M so that the holding arm length K is no less than four times, more preferably six times the holding arm width M as discussed above, the DLD is reduced and improved. This makes it possible to further enhance the effect of a reduction in the frequency shift amount.

Second Embodiment

In a second embodiment and thereafter, descriptions of the same constituent elements as those of the first embodiment will be omitted, and only different constituent elements from those of the first embodiment will be described. In particular, the same action effect brought by the same configuration will not be repeatedly described in each of the embodiments.

Figure 10:
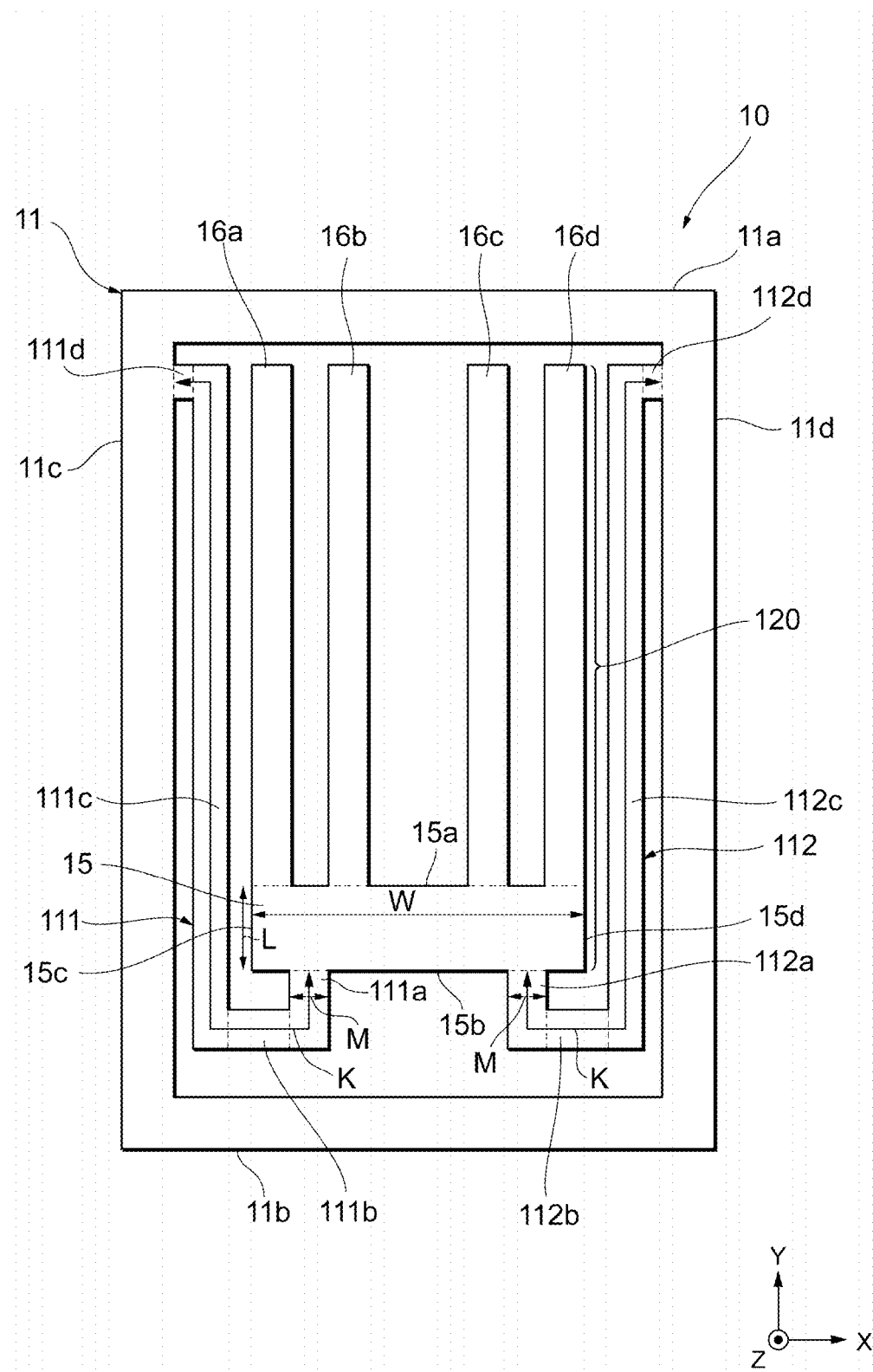
FIG. 10 is a plan view of a resonator according to a second exemplary embodiment in which an upper side substrate is detached.

FIG. 10 is a diagram illustrating an example of a plan view of the resonator 10 according to the present embodiment. Hereinafter, description of the detailed configuration of the resonance device 1 according to the present embodiment will be given focusing on different points from the first embodiment.

In the present embodiment, the vibration section 120 is connected to the holding unit 11 at the frame bodies 11c and 11d with the holding arms 111 and 112 that are connected to the long side 15b of the base section 15. Any of the vibration arms 16a to 16d does not have a weight G. In other words, the widths of the vibration arms 16a to 16d are each constant from the fixed end to the free end. Other constituent elements of the vibration section 120 are the same as those of the first embodiment.

In the present embodiment, the holding arm 111 includes an arm 111d in addition to the arms 111a to 111c. One end of the holding arm 111 is connected to the long side 15b of the base section 15, and the holding arm 111 extends therefrom toward the frame body 11b. Then, the holding arm 111 bends in a direction extending toward the frame body 11c (that is, the X axis direction), bends in a direction extending toward the frame body 11a (that is, the Y axis direction), and further bends in a direction extending toward the frame body 11c so that the other end thereof is connected to the frame body 11c.

The arm 111c is provided, between the base section 15 and the frame body 11c, opposing the frame body 11c so that the lengthwise direction thereof is parallel to the Y axis direction.

One end of the arm 111c is connected to the arm 111b at a side surface thereof. The other end of the arm 111c is connected to one end of the arm 111d at a side surface thereof. The width of the arm 111c defined in the X axis direction is approximately 20 µm, and the length thereof defined in the Y axis direction is approximately 620 µm, for example.

The arm 111d is provided, between the vibration arm 16a and the frame body 11c, opposing the frame body 11a so that the lengthwise direction thereof is parallel to the X axis direction. The one end of the arm 111d is connected to the side surface which is the other end of the arm 111c and is positioned on a side opposing the frame body 11c. The other end of the arm 111d is connected to the frame body 11c at a position opposing an end portion of the free end of the vibration arm 16a, and the arm 111d extends therefrom in a direction substantially perpendicular to the frame body 11c, that is, in the X axis direction. The width of the arm 111d defined in the Y axis direction is approximately 20 µm, and the length thereof defined in the X axis direction is approximately 10 µm, for example.

In the present embodiment, the holding arm length K refers to a total sum of the shortest distance between the centers of the end surfaces of the one end of the arm 111a and the other end thereof (the connection surface with the base section 15 and the end surface of the other end), the shortest distance between the centers of the end surfaces of the one end of the arm 111b and the other end thereof (the connection surface with the arm 111a and the connection surface with the arm 111c), the shortest distance between the end surfaces of the one end of the arm 111c and the other end thereof, and the shortest distance between the centers of the end surfaces of the one end of the arm 111d and the other end thereof (a connection surface with the arm 111c and a connection surface with the frame body 11c). The holding arm width M is the same as that of the first embodiment.

Other arms of the holding arm 111 are the same as those of the first embodiment.

In the present embodiment, the holding arm 112 includes an arm 112d in addition to the arms 112a to 112c. One end of the holding arm 112 is connected to the long side 15b of the base section 15, and the holding arm 112 extends therefrom toward the frame body 11b. Then, the holding arm 112 bends in a direction extending toward the frame body 11d (that is, the X axis direction), bends in a direction extending toward the frame body 11a (that is, the Y axis direction), and further bends in a direction extending toward the frame body 11d so that the other end thereof is connected to the frame body 11d.

The arm 112c is provided, between the base section 15 and the frame body 11d, opposing the frame body 11d so that the lengthwise direction thereof is parallel to the Y axis direction.

One end of the arm 112c is connected to the arm 112b at a side surface thereof. The other end of the arm 112c is connected to one end of the arm 112d at a side surface thereof. The width of the arm 112c defined in the X axis direction is approximately 20 µm, and the length thereof defined in the Y axis direction is approximately 620 µm, for example.

The arm 112d is provided, between the vibration arm 16d and the frame body 11d, opposing the frame body 11a so that the lengthwise direction thereof is parallel to the X axis direction. The one end of the arm 112d is connected to the side surface which is the other end of the arm 112c and is positioned on a side opposing the frame body 11d. The other end of the arm 112d is connected to the frame body 11d at a position opposing an end portion of the free end of the vibration arm 16d, and the arm 112d extends therefrom in a direction substantially perpendicular to the frame body 11d, that is, in the X axis direction. The width of the arm 112d defined in the Y axis direction is approximately 20 µm, and the length thereof defined in the X axis direction is approximately 10 µm, for example. The holding arm length K and the holding arm width M of the holding arm 112 are defined in the same manner as the holding arm 111.

Other arms of the holding arm 112 are the same as those of the first embodiment.

In the present embodiment, as discussed thus far, the vibration section 120 is connected to the frame bodies 11c and 11d with the holding arms 111 and 112. Increasing the bending portions of the holding arms 111 and 112 makes it possible to further disperse the moment at the holding arms 111 and 112 and further enhance the effect of suppression in resonant frequency shift.

Other constituent elements and effects are the same as those of the first embodiment.

Third Embodiment

Figure 11:
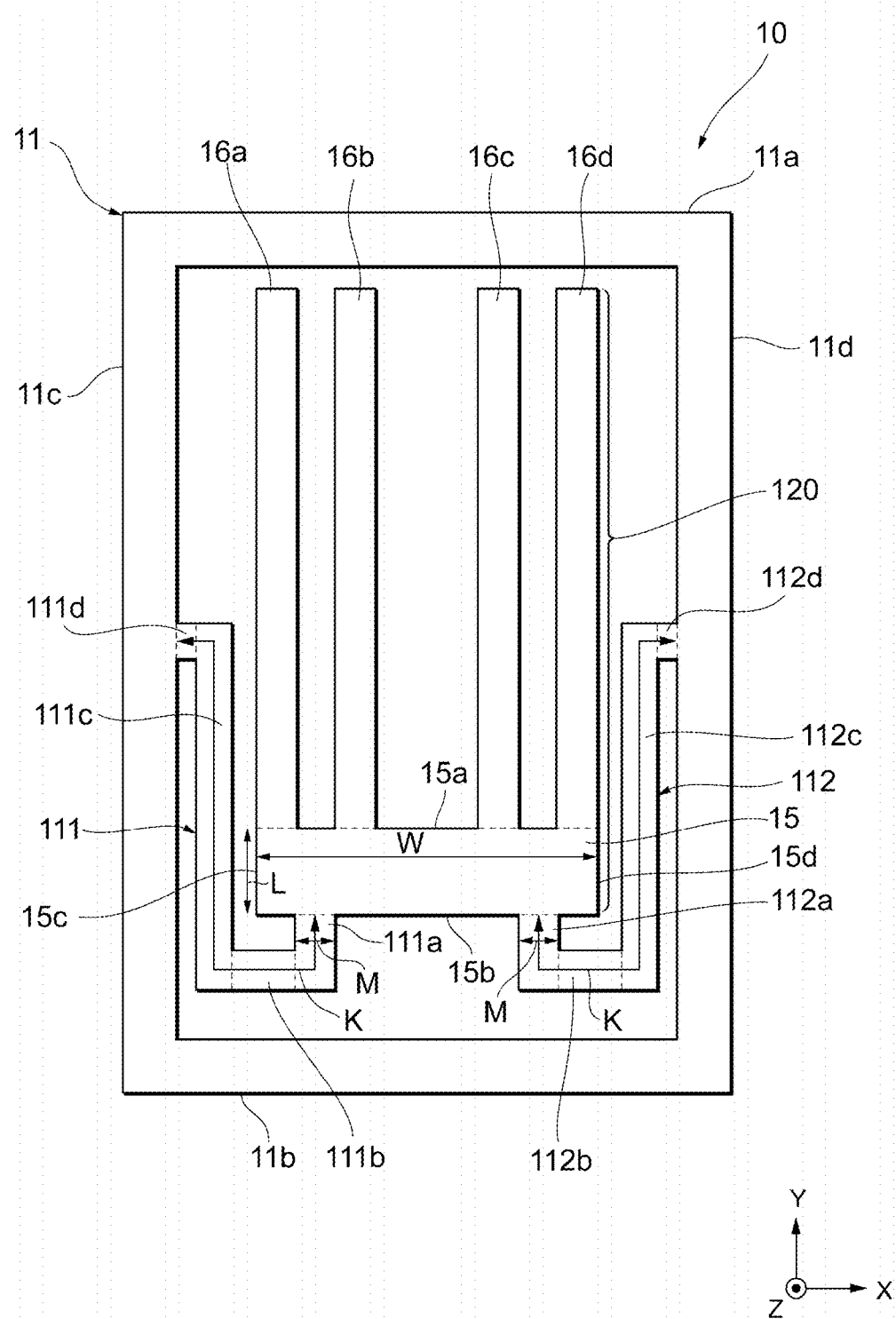
FIG. 11 is a plan view of a resonator according to a third exemplary embodiment in which an upper side substrate is detached.

FIG. 11 is a diagram illustrating an example of a plan view of the resonator 10 according to the present embodiment. Hereinafter, description of the detailed configuration of the resonance device 1 according to the present embodiment will be given focusing on different points from the first embodiment.

In the present embodiment, the vibration section 120 is connected to the holding unit 11 at the frame bodies 11c and 11d with the holding arms 111, 112 that are connected to the long side 15b of the base section 15. Any of the vibration arms 16a to 16d does not have a weight G. In other words, the widths of the vibration arms 16a to 16d are each constant from the fixed end to the free end. Other constituent elements of the vibration section 120 are the same as those of the first embodiment.

In the present embodiment, the holding arm 111 includes the arm 111d in addition to the arms 111a to 111c. One end of the holding arm 111 is connected to the long side 15b of the base section 15, and the holding arm 111 extends therefrom toward the frame body 11b. Then, the holding arm 111 bends in a direction extending toward the frame body 11c (that is, the X axis direction), bends in a direction extending toward the frame body 11a (that is, the Y axis direction), and further bends in a direction extending toward the frame body 11c so that the other end thereof is connected to the frame body 11c.

The arm 111c is provided, between the base section 15 and the frame body 11c, opposing the frame body 11c so that the lengthwise direction thereof is parallel to the Y axis direction.

One end of the arm 111c is connected to the arm 111b at a side surface thereof. The other end of the arm 111c is connected to one end of the arm 111d at a side surface thereof. The width of the arm 111c defined in the X axis direction is approximately 20 µm, and the length thereof defined in the Y axis direction is approximately 140 µm, for example.

The arm 111d is provided, between the frame body 11c and the vicinity of the connection portion between the base section 15 and the vibration arm 16a, opposing the frame body 11a so that the lengthwise direction thereof is parallel to the X axis direction. The one end of the arm 111d is connected to the side surface which is the other end of the arm 111c and is positioned on a side opposing the frame body 11c. The other end of the arm 111d is connected to the frame body 11c in the vicinity of a position opposing the long side 15a of the base section 15, and the arm 111d extends therefrom in a direction substantially perpendicular to the frame body 11c, that is, in the X axis direction. The width of the arm 111d defined in the Y axis direction is approximately 20 µm, for example.

The holding arm length K and the holding arm width M of the present embodiment are defined in the same manner as the second embodiment. Other arms of the holding arm 111 are the same as those of the first embodiment.

In the present embodiment, the holding arm 112 includes the arm 112d in addition to the arms 112a to 112c. One end of the holding arm 112 is connected to the long side 15b of the base section 15, and the holding arm 112 extends therefrom toward the frame body 11b. Then, the holding arm 112 bends in a direction extending toward the frame body 11d (that is, the X axis direction), bends in the direction extending toward the frame body 11a (that is, the Y axis direction), and further bends in a direction extending toward the frame body 11d so that the other end thereof is connected to the frame body 11d.

The arm 112c is provided, between the base section 15 and the frame body 11d, opposing the frame body 11d so that the lengthwise direction thereof is parallel to the Y axis direction.

One end of the arm 112c is connected to the arm 112b at a side surface thereof. The other end of the arm 112c is connected to one end of the arm 112d at a side surface thereof. The width of the arm 112c defined in the X axis direction is approximately 20 µm, and the length thereof defined in the Y axis direction is approximately 140 µm, for example.

The arm 112d is provided, between the frame body 11d and the vicinity of the connection portion between the base section 15 and the vibration arm 16d, opposing the frame body 11a so that the lengthwise direction thereof is parallel to the X axis direction. The one end of the arm 112d is connected to the side surface which is the other end of the arm 112c and is positioned on a side opposing the frame body 11d. The other end of the arm 112d is connected to the frame body 11d in the vicinity of a position opposing the long side 15a of the base section 15, and the arm 112d extends therefrom in a direction substantially perpendicular to the frame body 11d, that is, in the X axis direction. The width of the arm 112d defined in the Y axis direction is approximately 20 µm, for example.

Other arms of the holding arm 112 are the same as those of the first embodiment.

In the present embodiment, as discussed thus far, the vibration section 120 is connected to the frame bodies 11c and 11d with the holding arms 111 and 112. Increasing the bending portions of the holding arms 111 and 112 makes it possible to further disperse the moment at the holding arms 111 and 112 and further enhance the effect of suppression in resonant frequency shift.

Other constituent elements and effects are the same as those of the first embodiment.

Fourth Embodiment

Figure 12:
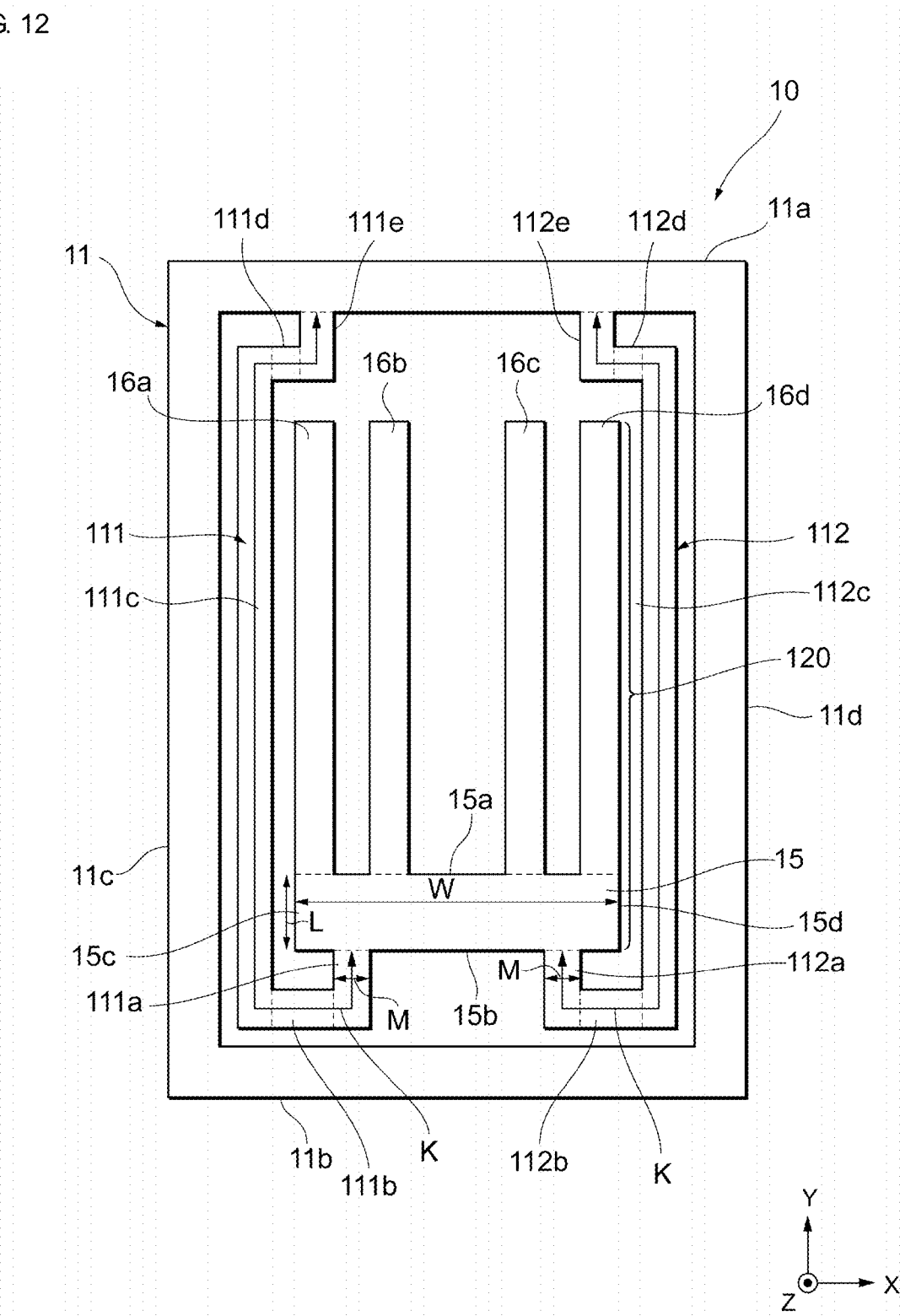
FIG. 12 is a plan view of a resonator according to a fourth exemplary embodiment in which an upper side substrate is detached.

FIG. 12 is a diagram illustrating an example of a plan view of the resonator 10 according to the present embodiment. Hereinafter, description of the detailed configuration of the resonance device 1 according to the present embodiment will be given focusing on different points from the first embodiment.

In the present embodiment, any of the vibration arms 16a to 16d of the vibration section 120 does not have a weight G. In other words, the widths of the vibration arms 16a to 16d are each constant from the fixed end to the free end.

Other constituent elements of the vibration section 120 are the same as those of the first embodiment.

In the present embodiment, the holding arm 111 includes the arm 111d and an arm 111e in addition to the arms 111a to 111c. One end of the holding arm 111 is connected to the long side 15b of the base section 15, and the holding arm 111 extends therefrom toward the frame body 11b. Then, the holding arm 111 bends in a direction extending toward the frame body 11c (that is, the X axis direction), bends in a direction extending toward the frame body 11a (that is, the Y axis direction), bends again in a direction extending toward the frame body 11d, and further bends in the direction extending toward the frame body 11a so that the other end thereof is connected to the frame body 11a.

One end of the arm 111c is connected to the arm 111b at a side surface thereof. The other end of the arm 111c is connected to one end of the arm 111d at a side surface thereof. The width of the arm 111c defined in the X axis direction is approximately 20 µm, and the length thereof defined in the Y axis direction is approximately 640 µm, for example.

The arm 111d is provided, between the vibration arm 16a and the frame body 11c, opposing the frame body 11a so that the lengthwise direction thereof is parallel to the X axis direction. One end of the arm 111d is connected to the side surface which is the other end of the arm 111c and is positioned on a side opposing the frame body 11c, and the arm 111d extends therefrom in a direction substantially perpendicular to the frame body 11c, that is, in the X axis direction. The other end of the arm 111d is connected to a side surface which is one end of the arm 111e and is positioned on a side opposing the frame body 11c. The width of the arm 111d defined in the Y axis direction is approximately 20 µm, and the length thereof defined in the X axis direction is approximately 20 µm, for example.

The arm 111e is provided, between the vibration arm 16a and the frame body 11a, opposing the frame body 11c so that the lengthwise direction thereof is parallel to the Y axis direction. The one end of the arm 111e is connected to the other end of the arm 111d at the side surface thereof. The other end of the arm 111e is connected to the frame body 11a at a position opposing the free end of the vibration arm 16a, and the arm 111e extends therefrom in a direction substantially perpendicular to the frame body 11a, that is, in the Y axis direction. The arm 111e may be formed on the frame body 11c side relative to the free end of the vibration arm 16a. The width of the arm 111e defined in the X axis direction is approximately 20 µm, and the length thereof defined in the Y axis direction is approximately 40 µm, for example.

In the present embodiment, the holding arm length K refers to a total sum of the shortest distance between the centers of the end surfaces of the one end of the arm 111a and the other end thereof (the connection surface with the base section 15 and the end surface of the other end), the shortest distance between the centers of the end surfaces of the one end of the arm 111b and the other end thereof (the connection surface with the arm 111a and the connection surface with the arm 111c), the shortest distance between the end surfaces of the one end of the arm 111c and the other end thereof, the shortest distance between the centers of the end surfaces of the one end of the arm 111d and the other end thereof (the connection surface with the arm 111c and a connection surface with the arm 111e), and the shortest distance between the end surfaces of the one end of the arm 111e and the other end thereof (the end surface of the one end and a connection surface with the frame body 11a). The holding arm width M is the same as that of the first embodiment.

Other arms of the holding arm 111 are the same as those of the first embodiment.

In the present embodiment, the holding arm 112 includes the arm 112d and an arm 112e in addition to the arms 112a to 112c. One end of the holding arm 112 is connected to the long side 15b of the base section 15, and the holding arm 112 extends therefrom toward the frame body 11b. Then, the holding arm 112 bends in the direction extending toward the frame body 11d (that is, the X axis direction), bends in the direction extending toward the frame body 11a (that is, the Y axis direction), bends again in the direction extending toward the frame body 11c, and further bends in the direction extending toward the frame body 11a so that the other end thereof is connected to the frame body 11a.

One end of the arm 112c is connected to the arm 112b at a side surface thereof. The other end of the arm 112c is connected to one end of the arm 112d at a side surface thereof. The width of the arm 112c defined in the X axis direction is approximately 20 μm, and the length thereof defined in the Y axis direction is approximately 640 μm, for example.

The arm 112d is provided, between the vibration arm 16d and the frame body 11d, opposing the frame body 11a so that the lengthwise direction thereof is parallel to the X axis direction. One end of the arm 112d is connected to the side surface which is the other end of the arm 112c and is positioned on a side opposing the frame body 11d, and the arm 112d extends therefrom in a direction substantially perpendicular to the frame body 11d, that is, in the X axis direction. The other end of the arm 112d is connected to a side surface which is one end of the arm 112e and is positioned on a side opposing the frame body 11d. The width of the arm 112d defined in the Y axis direction is approximately 20 μm, and the length thereof defined in the X axis direction is approximately 20 μm, for example.

The arm 112e is provided, between the vibration arm 16d and the frame body 11a, opposing the frame body 11d so that the lengthwise direction thereof is parallel to the Y axis direction. The one end of the arm 112e is connected to the other end of the arm 112d at the side surface thereof. The other end of the arm 112e is connected to the frame body 11a at a position opposing the free end of the vibration arm 16d, and the arm 112e extends therefrom in the direction substantially perpendicular to the frame body 11a, that is, in the Y axis direction. The arm 112e may be formed on the frame body 11d side relative to the free end of the vibration arm 16d. The width of the arm 112e defined in the X axis direction is approximately 20 μm, and the length thereof defined in the Y axis direction is approximately 40 μm, for example. The holding arm length K and the holding arm width M of the holding arm 112 are defined in the same manner as the holding arm 111.

Other arms of the holding arm 112 are the same as those of the first embodiment.

As discussed above, in the present embodiment, increasing the bending portions of the holding arms 111 and 112 makes it possible to further disperse the moment at the holding arms 111 and 112 and further enhance the effect of suppression in resonant frequency shift.

Other constituent elements and effects are the same as those of the first embodiment.

Fifth Embodiment

Figure 13:
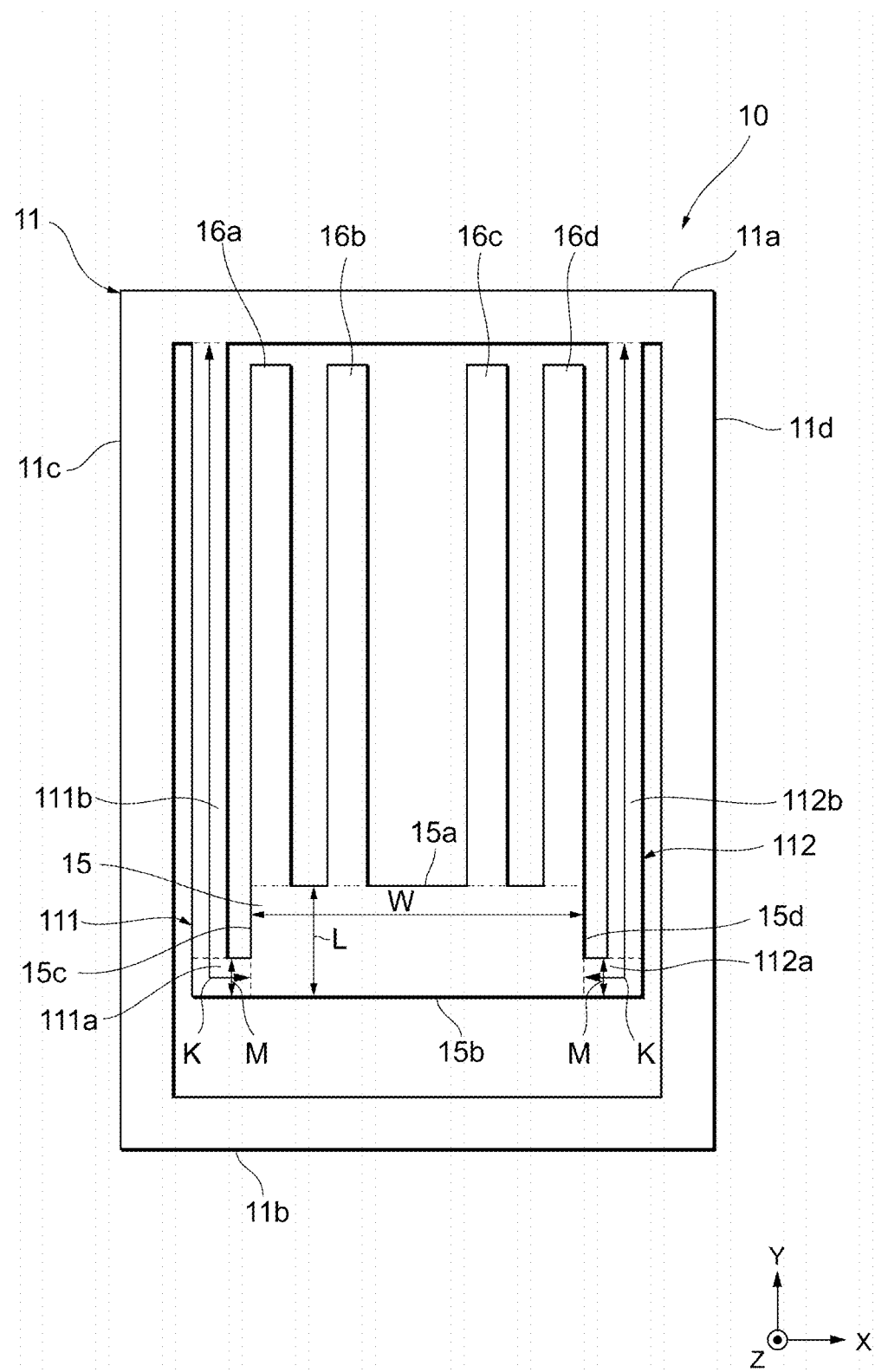
FIG. 13 is a plan view of a resonator according to a fifth exemplary embodiment in which an upper side substrate is detached.

FIG. 13 is a diagram illustrating an example of a plan view of the resonator 10 according to the present embodiment. Hereinafter, description of the detailed configuration of the resonance device 1 according to the present embodiment will be given focusing on different points from the second embodiment.

In the present embodiment, the holding arm 111 includes the arms 111a and 111b. One end of the holding arm 111 is connected to the short side 15c of the base section 15, and the holding arm 111 extends therefrom toward the frame body 11c. Then, the holding arm 111 bends in a direction extending toward the frame body 11a (Y axis direction) so that the other end thereof is connected to the frame body 11a.

Specifically, in the present embodiment, the arm 111a is provided, between the base section 15 and the frame body 11c, opposing the frame body 11a so that the lengthwise direction thereof is parallel to the X axis direction. One end of the arm 111a is connected to a side surface on the short side 15c side of the base section 15 at an end surface thereof. The other end of the arm 111a is connected to the arm 111b at a side surface thereof. The width of the arm 111a defined in the Y axis direction is approximately 20 μm, and the length thereof defined in the X axis direction is approximately 40 μm.

The arm 111b is provided, between the base section 15 and the frame body 11c, opposing the frame body 11c so that the lengthwise direction thereof is parallel to the Y axis direction. One end of the arm 111b is connected to the side surface which is the other end of the arm 111a and is positioned on a side opposing the frame body 11a, and the arm 111b extends therefrom in a direction substantially perpendicular to the arm 111a, that is, in the Y axis direction. The other end of the arm 111b is connected to the frame body 11a. The width of the arm 111b defined in the X axis direction is approximately 20 μm, and the length thereof defined in the Y axis direction is approximately 620 μm, for example.

Next, definitions of the holding arm width M and the holding arm length K of the holding arm 111 in the present embodiment will be described. In the present embodiment, the holding arm width M refers to the length of a side parallel to a side end of the base section 15 (short side 15c) in the end surface of the arm 111a (contact surface with the base section 15).

Meanwhile, the holding arm length K of the holding arm 111 in the present embodiment refers to a total sum of the shortest distance between the centers of the end surfaces of the one end of the arm 111a and the other end thereof (a connection surface with the base section 15 and the end surface of the other end) and the shortest distance between the centers of the end surfaces of the one end of the arm 111b and the other end thereof (a connection surface with the arm 111a and a connection surface with the frame body 11a).

Other constituent elements of the holding arm 111 are the same as those of the second embodiment. The holding arm 112 is configured in the same manner as the holding arm 111.

Other constituent elements and functions of the resonator 10 are the same as those of the second embodiment.

Sixth Embodiment

Figure 14:
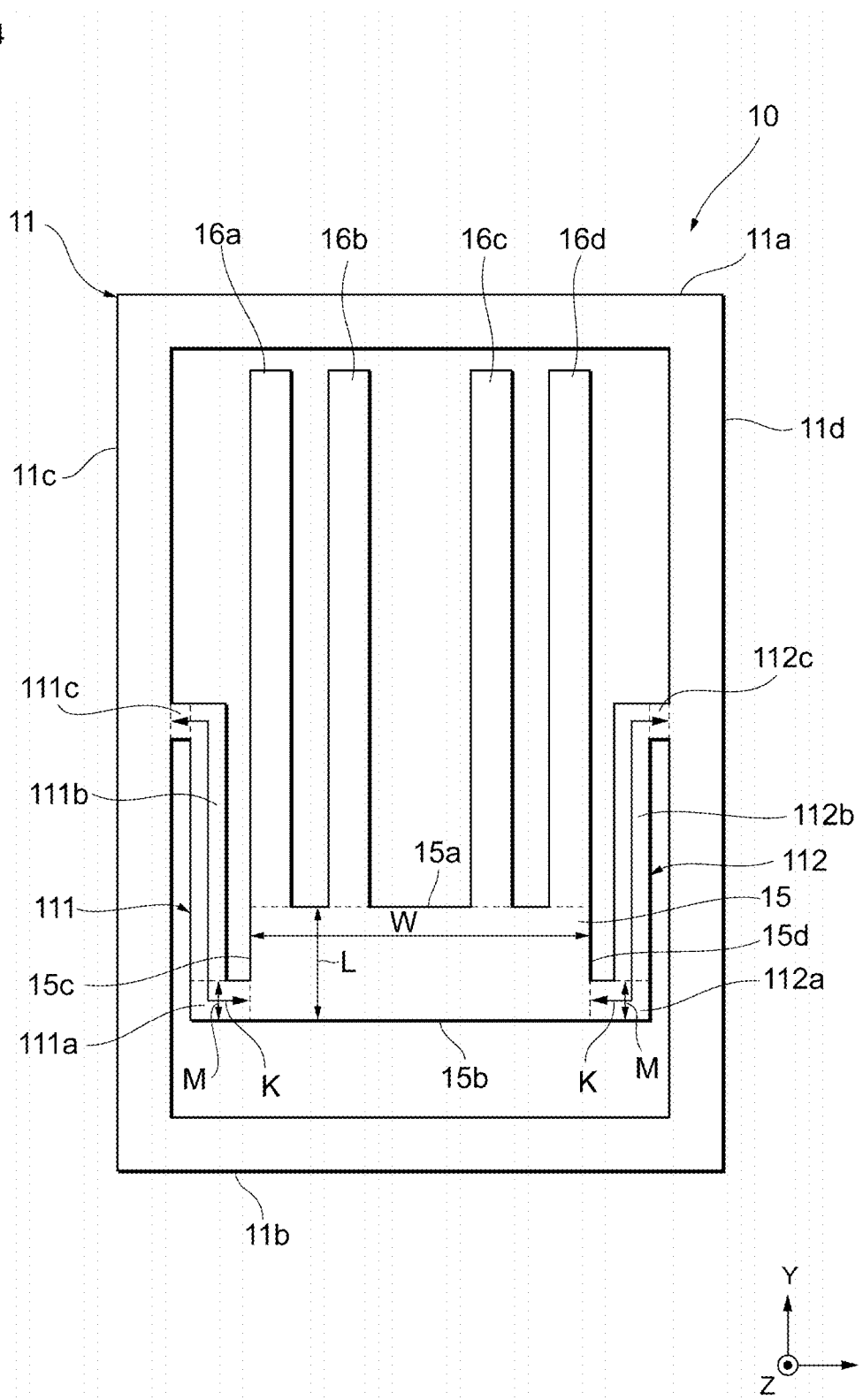
FIG. 14 is a plan view of a resonator according to a sixth exemplary embodiment in which an upper side substrate is detached.

FIG. 14 is a diagram illustrating an example of a plan view of the resonator 10 according to the present embodiment. Hereinafter, description of the detailed configuration of the resonance device 1 according to the present embodiment will be given focusing on different points from the fifth embodiment.

In the present embodiment, the holding arm 111 includes the arm 111c in addition to the arms 111a and 111b. One end of the holding arm 111 is connected to the short side 15c of the base section 15, and the holding arm 111 extends therefrom toward the frame body 11c. Then, the holding arm 111 bends in a direction extending toward the frame body 11a (Y axis direction) and further bends in a direction extending toward the frame body 11c (X axis direction) so that the other end thereof is connected to the frame body 11c.

A specific configuration of the holding arm 111 will be described below. The configuration of the arm 111a is the same as that of the arm 111a of the fifth embodiment.

In the present embodiment, the arm 111b is provided, between the base section 15 and the frame body 11c, opposing the frame body 11c so that the lengthwise direction thereof is parallel to the Y axis direction. One end of the arm 111b is connected to the side surface which is the other end of the arm 111a and is positioned on a side opposing the frame body 11a, and the arm 111b extends therefrom in a direction substantially perpendicular to the arm 111a, that is, in the Y axis direction. The other end of the arm 111b is connected to the arm 111c at a side surface on a side opposing the frame body 11c. The width of the arm 111b defined in the X axis direction is approximately 20 μm, and the length thereof defined in the Y axis direction is approximately 280 for example.

The arm 111c is provided, between the base section 15 and the frame body 11c, opposing the frame body 11a so that the lengthwise direction thereof is parallel to the X axis direction. One end of the arm 111c is connected to the side surface which is the other end of the arm 111b and is positioned on a side opposing the frame body 11c, and the arm 111c extends therefrom in a direction substantially perpendicular to the arm 111b, that is, in the X axis direction. The other end of the arm 111c is connected to the frame body 11c. The width of the arm 111c defined in the Y axis direction is approximately 20 μm, and the length thereof defined in the X axis direction is approximately 20 μm, for example.

Next, definitions of the holding arm width M and the holding arm length K of the holding arm 111 in the present embodiment will be described. In the present embodiment, the holding arm width M refers to the length of a side parallel to the side end of the base section 15 (short side 15c) in the end surface of the arm 111a (contact surface with the base section 15).

Meanwhile, the holding arm length K of the holding arm 111 in the present embodiment refers to a total sum of the shortest distance between the centers of the end surfaces of the one end of the arm 111a and the other end thereof (the connection surface with the base section 15 and the end surface of the other end), the shortest distance between the centers of the end surfaces of the one end of the arm 111b and the other end thereof (the connection surface with the arm 111a and the connection surface with the arm 111c), and the shortest distance between the centers of the end surfaces of the one end of the arm 111c and the other end thereof (the connection surface with the arm 111b and the connection surface with the frame body 11c).

Other constituent elements of the holding arm 111 are the same as those of the fifth embodiment. The holding arm 112 is configured in the same manner as the holding arm 111.

Other constituent elements and functions of the resonator 10 are the same as those of the second embodiment.

Seventh Embodiment

Figure 15:
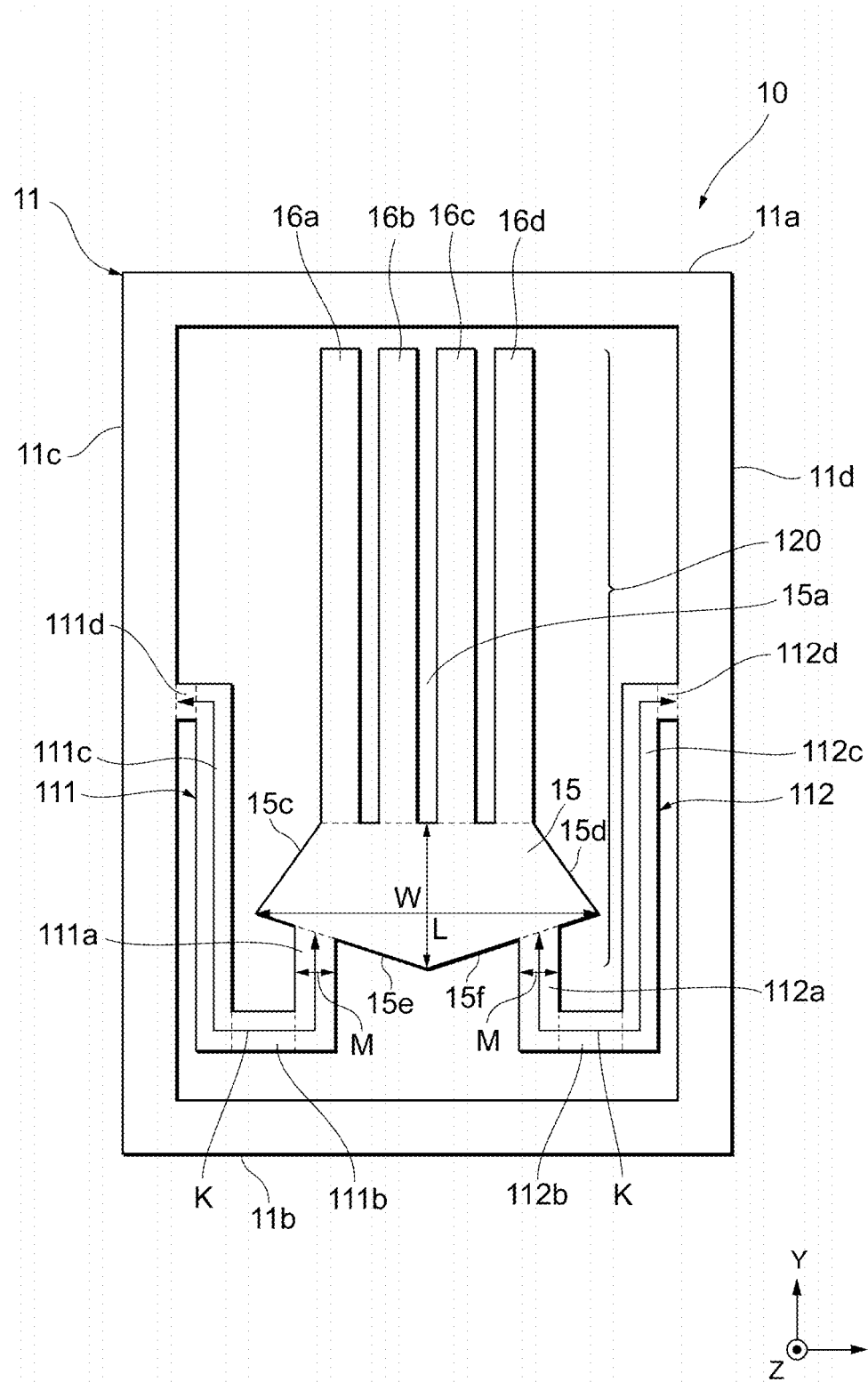
FIG. 15 is a plan view of a resonator according to a seventh exemplary embodiment in which an upper side substrate is detached.

FIG. 15 is a diagram illustrating an example of a plan view of the resonator 10 according to the present embodiment. Hereinafter, description of the detailed configuration of the resonance device 1 according to the present embodiment will be given focusing on different points from the third embodiment.

In the present embodiment, the base section 15 includes, at its rear end, two short sides 15e and 15f in place of the long side 15b in the third embodiment. In other words, the base section 15 according to the present embodiment is formed in a pentagonal shape that includes the long side 15a and the short sides 15c to 15f, and is line-symmetric with respect to a perpendicular bisector of the long side 15a in a plan view. In the present embodiment, the holding arms 111 and 112 are respectively connected to the short sides 15e and 15f as a region on the rear end side of the base section 15.

Other constituent elements and effects are the same as those of the third embodiment.

Eighth Embodiment

Figure 16:
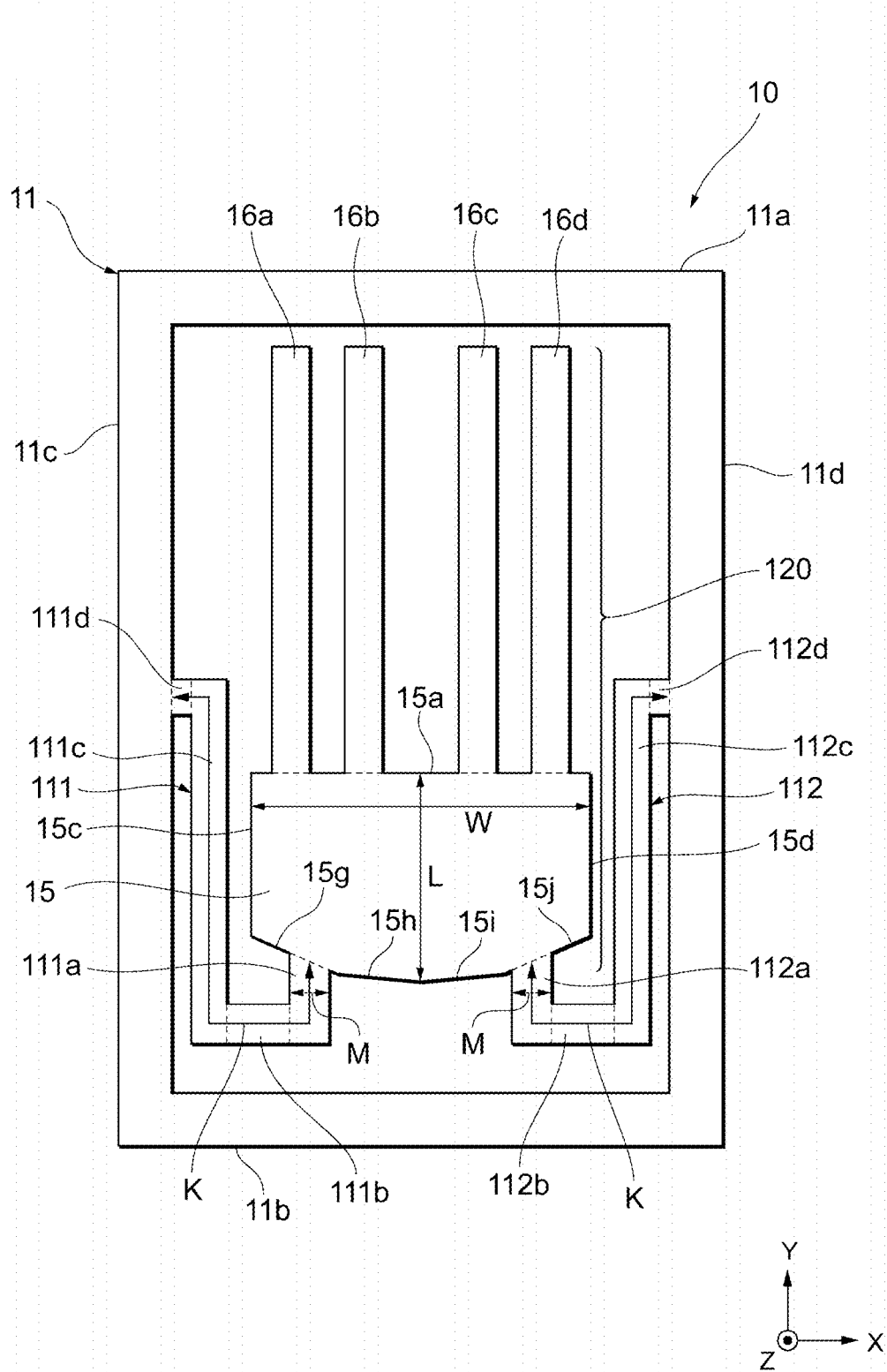
FIG. 16 is a plan view of a resonator according to an eighth exemplary embodiment in which an upper side substrate is detached.

FIG. 16 is a diagram illustrating an example of a plan view of the resonator 10 according to the present embodiment. Hereinafter, description of the detailed configuration of the resonance device 1 according to the present embodiment will be given focusing on different points from the third embodiment.

In the present embodiment, the base section 15 includes, at its rear end, four short sides 15g to 15j in place of the long side 15b in the third embodiment. In other words, the rear end of the base section 15 according to the present embodiment is formed in a substantially circular arc shape in a plan view. In the present embodiment, the holding arms 111 and 112 are respectively connected to the short sides 15g and 15j as a region on the rear end side of the base section 15.

Other constituent elements and effects are the same as those of the third embodiment.

Ninth Embodiment

Figure 17:
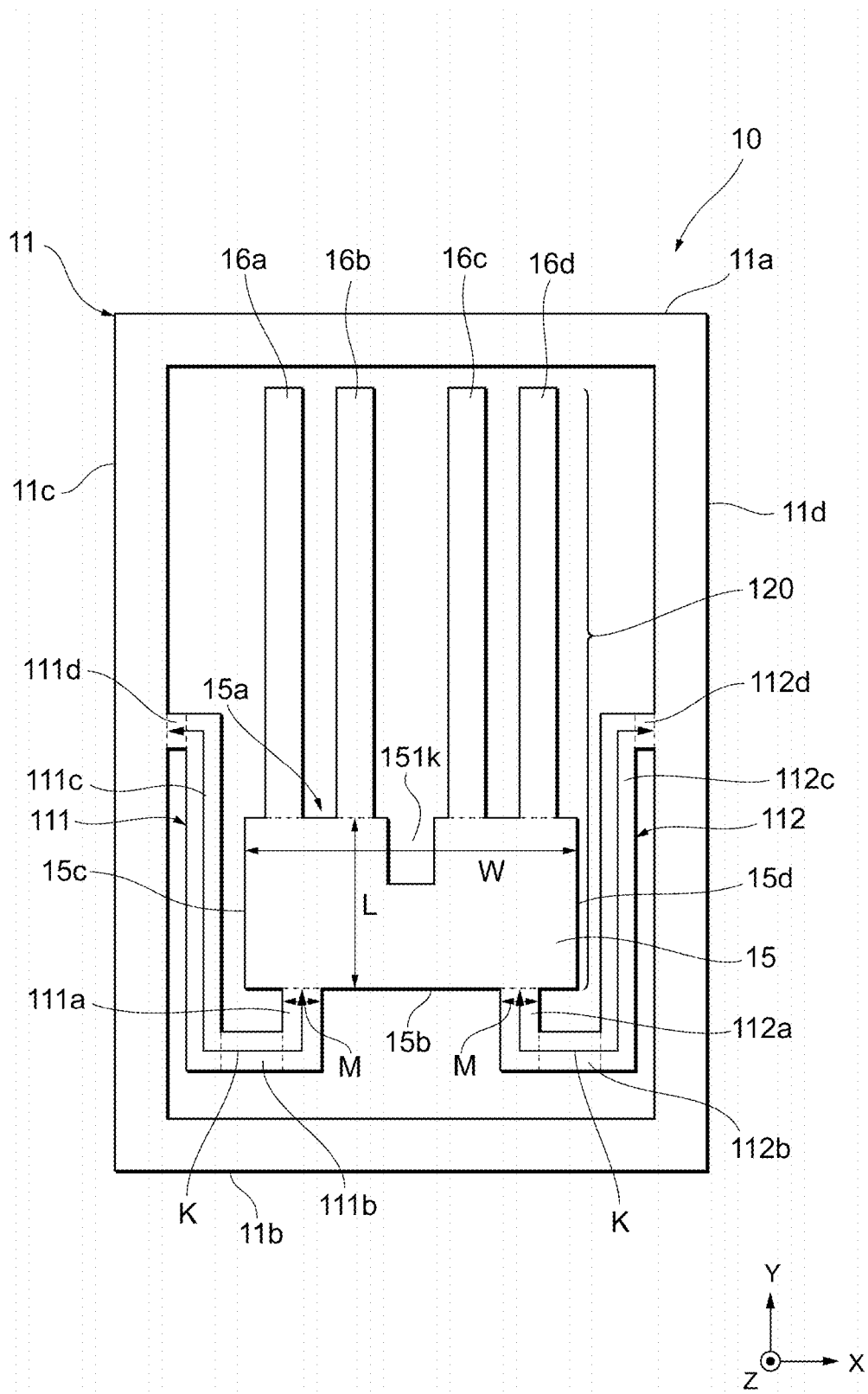
FIG. 17 is a plan view of a resonator according to a ninth exemplary embodiment in which an upper side substrate is detached.

FIG. 17 is a diagram illustrating an example of a plan view of the resonator 10 according to the present embodiment. Hereinafter, description of the detailed configuration of the resonance device 1 according to the present embodiment will be given focusing on different points from the third embodiment.

In the present embodiment, a recess 151k is formed in the base section 15 between a connection portion with the vibration arm 16b and a connection portion with the vibration arm 16c at the front end of the base section 15. To be specific, in the present embodiment, the long side 15a at the front end extends in parallel to the long side 15b from a connection portion with the short side 15c to the connection portion with the vibration arm 16b. The long side 15a bends therefrom substantially perpendicularly toward the long side 15b side, extends in parallel to the short side 15c, and further bends near the middle of the short side 15c substantially perpendicularly toward the short side 15d side. After the bend, the long side 15a extends again in parallel to the long side 15b, and further bends near an extension line of the vibration arm 16c substantially perpendicularly toward the vibration arm 16c side. Furthermore, the long side 15a bends at the connection portion with the vibration arm 16c substantially perpendicularly toward the short side 15d side, and then extends to a connection portion with the short side 15d. Through this, the recess 151k is formed at the front end of the base section 15.

Other constituent elements and effects are the same as those of the third embodiment.

It is to be noted that the above-discussed embodiments are aimed at facilitating the understanding of the present invention, and are not intended to limit the interpretation on the present invention. The present invention can be modified/improved without departing from the spirit of the invention, and equivalents obtained through the modifications/improvements are also included in the present invention. In other words, in the case where those skilled in the art appropriately apply design change on the embodiments, such embodiments that are obtained through the stated design change are also included in the scope of the present invention as long as they have the features of the present invention. For example, constituent elements included in the above-discussed embodiments, and their arrangement, materials, conditions, shapes, sizes, and so on are not limited to the above-exemplified ones, and can appropriately be changed. For example, in the above-described embodiments, although it is described that the holding arms 111 and 112 are configured to bend twice or more, the invention is not limited thereto. The holding arms 111 and 112 may be configured to bend only once and connect the long side 15b of the base section 15 to the frame body 11c or 11d, for example. In this case, the resonance device 1 can be miniaturized. Further, in the above-described embodiments, although it is described that the holding arms 111 and 112 are configured to be connected to the long side 15b at the rear end of the base section 15, the invention is not limited thereto. The holding arms 111 and 112 may be configured to be respectively connected to the short sides 15c and 15d at the side ends of the base section 15, for example.

Although, in the above embodiments, it is described that the shape of the base section 15 is rectangular, the shape of the base section 15 is not limited to a rectangle. For example, the shape of the base section 15 includes a shape in which corners are circular or edges are chamfered, a shape in which opposing sides are approximately parallel to each other, or the like. In this case, the maximum length of the base section 15 in a direction substantially perpendicular to a direction in which the vibration arms 16a to 16d extend can be taken as a first long side length L, and the maximum length of the base section 15 in a direction passing through the center point of the first long side and substantially perpendicular to the first long side can be taken as a first short side length W.

It goes without saying that the above embodiments are merely examples, and that configurations described in different embodiments can partly replace each other or be combined as well; and such configurations that are obtained through the stated replacement or combination are also included in the scope of the present invention as long as they have the features of the present invention.

REFERENCE SIGNS LIST

1 RESONANCE DEVICE
10 RESONATOR
13 UPPER COVER
14 LOWER COVER
11 HOLDING UNIT
11a to 11d FRAME BODY
111 HOLDING ARM
111a to 111e ARM
112 HOLDING ARM
112a to 112e ARM
120 VIBRATION SECTION
15 BASE SECTION
15a, 15b LONG SIDE
15c, 15d SHORT SIDE
16a to 16d VIBRATION ARM
22 SiO$_2$ FILM
23 Si LAYER
24 PIEZOELECTRIC THIN FILM
25, 26 METAL LAYER

The invention claimed is:

1. A resonator comprising:
   a vibration member including:
      at least three vibration arms each having a fixed end and an open end, with at least two of the vibration arms configured to perform an out-of-plane bend with different phases, and
      a base having a front end coupled to the respective fixed ends of the at least three vibration arms and a rear end opposing the front end, the rear end being configured to bend in a direction of the out-of-plane bend when the at least two vibration arms perform the out-of-plane bend;
   a frame at least partially surrounding a periphery of the vibration member; and
   at least one holding arm disposed between the vibration member and the frame,
   wherein a first end of the at least one holding arm is connected to the base and a second end of the at least one holding arm is connected to the frame, and
   wherein the at least one holding arm bends in the direction of the out-of-plane bend when the base bends.

2. The resonator according to claim 1, wherein a portion between the at least two vibration arms performing the out-of-plane bend with different phases is a node.

3. The resonator according to claim 1, wherein a length of the base between the front end and the rear end in a lengthwise direction is 0.3 times or less than a width of the base between a left end and a right end of the base in a widthwise direction orthogonal to the lengthwise direction.

4. The resonator according to claim 1, wherein the at least one holding arm has a length that is four times or more than a width of the at least one holding arm.

5. The resonator according to claim 3, wherein a thickness of the base along a direction of the out-of-plane bend is equal to or less than 10 μm.

6. The resonator according to claim 5, wherein the length of the base is equal to or less than 80 μm.

7. The resonator according to claim 4, wherein the length of the at least one holding arm is greater than or equal to 150 μm.

8. The resonator according to claim 1, wherein the first end of the at least one holding arm is connected to the rear end of the base.

9. The resonator according to claim 3, wherein the first end of the at least one holding arm is connected to a position on the rear end of the base, such that a distance from a center of an end surface of the first end of the at least one holding arm to a center of an end surface of the front end of the base is 60% or less than half the width of the base.

10. The resonator according to claim 1, wherein the first end of the at least one holding arm is connected to an end surface of a side end of the base.

11. The resonator according to claim 1,
    wherein the frame includes a fixed portion disposed in a region opposing the respective open ends of the at least three vibration arms, and
    wherein the second end of the at least one holding arm is connected to the frame at the first fixed portion.

12. The resonator according to claim 1,
wherein the frame includes a fixed portion disposed in a region opposing the at least three vibration arms along a direction in which the at least three vibration arms extend, and
wherein the second end of the at least one holding arm is connected to the frame at the fixed portion.

13. A resonance device comprising the resonator according to claim 1.

14. A resonator comprising:
a frame;
a plurality of vibration arms each having a fixed end and an open end, with at least two of the plurality of vibration arms configured to perform an out-of-plane bend with different phases relative to each other;
a base having a front end coupled to the respective fixed ends of the plurality of vibration arms and a rear end opposing the front end, wherein the rear end of the base is configured to perform the out-of-plane bend when the at least two vibration arms perform the out-of-plane bend; and
a pair of holding arm disposed between the frame and opposing sides of the base with the plurality of vibration arms extending therebetween,
wherein a first end of each of the pair of holding arms is connected to the rear end of the base and a second end of each of the pair of holding arms is connected to the frame.

15. The resonator according to claim 14, wherein the pair of holding arms are each configured to perform the out-of-plane bend when the base bends.

16. The resonator according to claim 14, wherein a length of the base between the front end and the rear end in a lengthwise direction is 0.3 times or less than a width of the base between a left end and a right end of the base in a widthwise direction orthogonal to the lengthwise direction.

17. The resonator according to claim 16, wherein the first end of each of the pair of holding arms is connected to respective positions on the rear end of the base, such that a distance from a center of an end surface of the first end of each of the holding arms to a center of an end surface of the front end of the base is 60% or less than half the width of the base.

18. The resonator according to claim 14,
wherein the frame includes a fixed portion disposed in a region opposing the respective open ends of the plurality of vibration arms, and
wherein the second end of each of the holding arms is connected to the frame at the first fixed portion.

19. The resonator according to claim 14,
wherein the frame includes a pair of fixed portions disposed in respective regions opposing the plurality of vibration arms along a direction in which the plurality of vibration arms extend, and
wherein the second end of each of the holding arms is connected to the frame at the pair of fixed portions, respectively.

20. The resonator according to claim 14, wherein a portion between the at least two vibration arms performing the out-of-plane bend with different phases is a node.

* * * * *